United States Patent
Suehiro et al.

(10) Patent No.: US 7,736,016 B2
(45) Date of Patent: Jun. 15, 2010

(54) LIGHT SOURCE UNIT

(75) Inventors: Yoshinobu Suehiro, Aichi-ken (JP); Koji Tasumi, Aichi-ken (JP); Kazue Tagata, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 0 days.

(21) Appl. No.: 12/289,406

(22) Filed: Oct. 27, 2008

(65) Prior Publication Data

US 2009/0122541 A1    May 14, 2009

(30) Foreign Application Priority Data

Oct. 25, 2007    (JP)    ............................. 2007-277833

(51) Int. Cl.
*F21V 29/00*    (2006.01)

(52) U.S. Cl. .................. 362/218; 362/294; 362/373; 362/219

(58) Field of Classification Search ............ 362/217.05, 362/217.11, 223, 249.02, 267, 310, 249.06, 362/218, 219, 294, 373
See application file for complete search history.

(56) References Cited

U.S. PATENT DOCUMENTS

| | | | | |
|---|---|---|---|---|
| 3,710,094 A | * | 1/1973 | Monte et al. ................. | 362/218 |
| 5,479,327 A | * | 12/1995 | Chen ........................... | 362/222 |
| 5,688,042 A | * | 11/1997 | Madadi et al. .............. | 362/240 |
| 6,227,686 B1 | * | 5/2001 | Takahashi et al. ........... | 362/345 |
| 7,293,898 B2 | * | 11/2007 | Kumthampinij et al. .... | 362/294 |
| 2006/0164836 A1 | | 7/2006 | Suehiro et al. | |
| 2006/0245201 A1 | | 11/2006 | Wada et al. | |
| 2009/0034263 A1 | * | 2/2009 | Stenback et al. ............ | 362/296 |

FOREIGN PATENT DOCUMENTS

| | | |
|---|---|---|
| JP | 2002-093206 | 3/2002 |
| JP | 2004-327138 | 11/2004 |
| JP | 2006-344450 | 12/2006 |

\* cited by examiner

*Primary Examiner*—Thomas M Sember
(74) *Attorney, Agent, or Firm*—McGinn IP Law Group, PLLC

(57) ABSTRACT

A light source unit includes a linear light source portion including a plurality of glass-sealed LEDs, a heat radiation portion including a heat radiation plate connected to the linear light source portion, and a case including an outside wall that is disposed apart from the linear light source portion and the heat radiation portion, a support portion connecting the outside wall to heat radiation portion, and a vent hole formed in the outside wall.

18 Claims, 17 Drawing Sheets

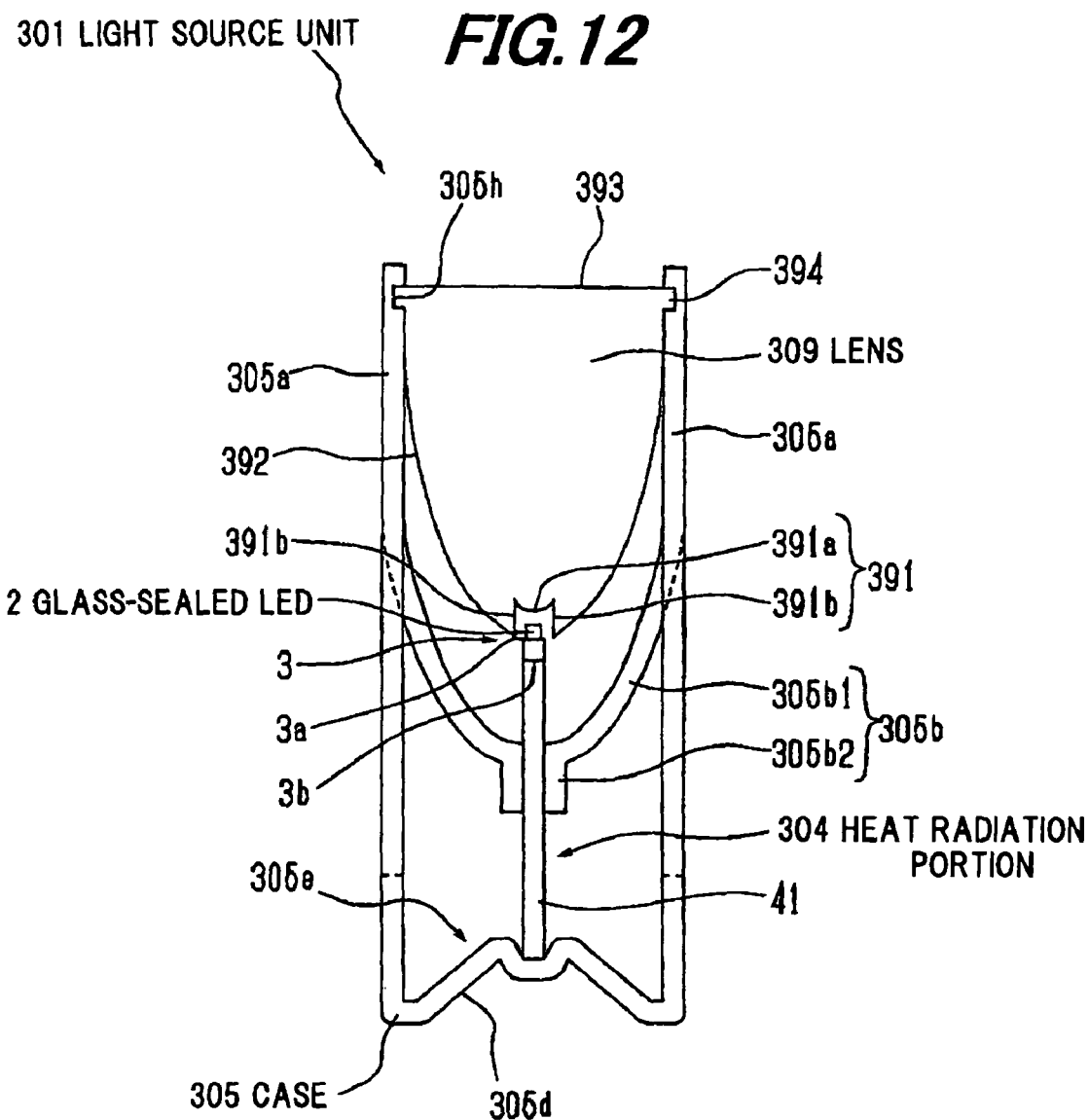

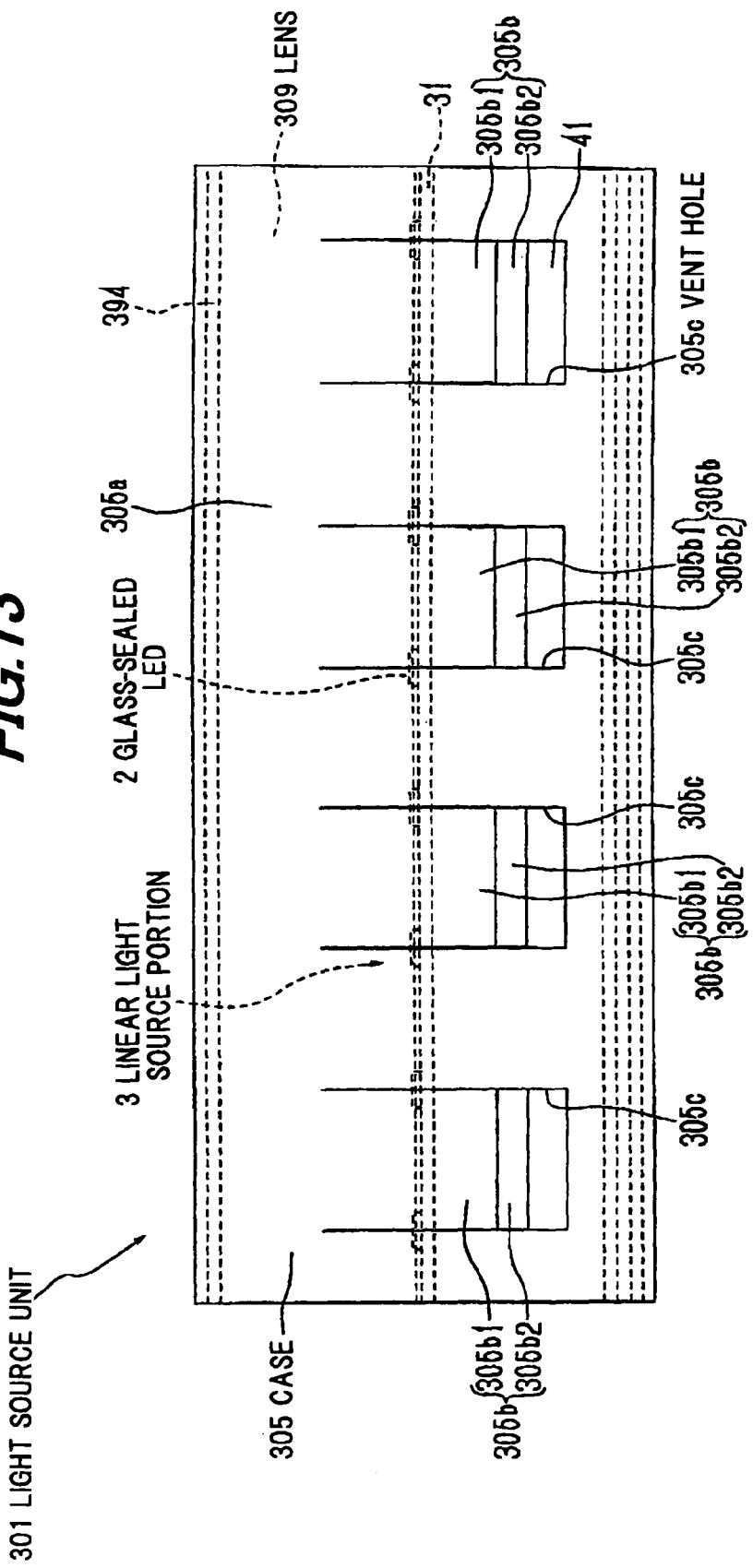

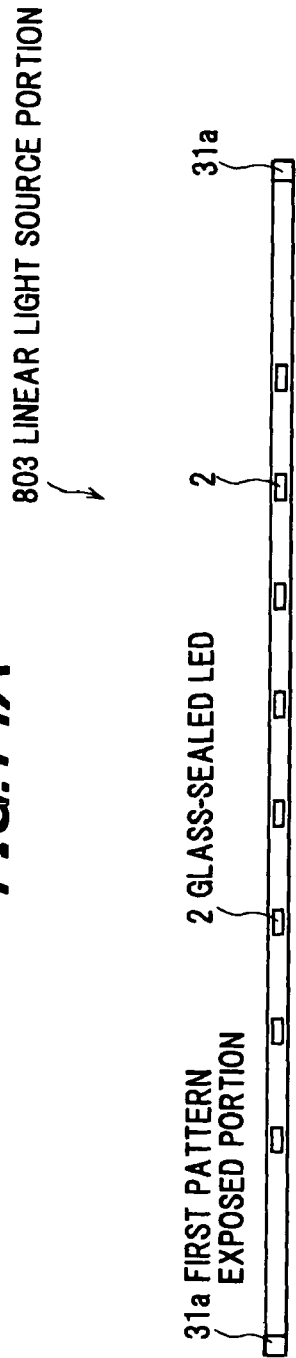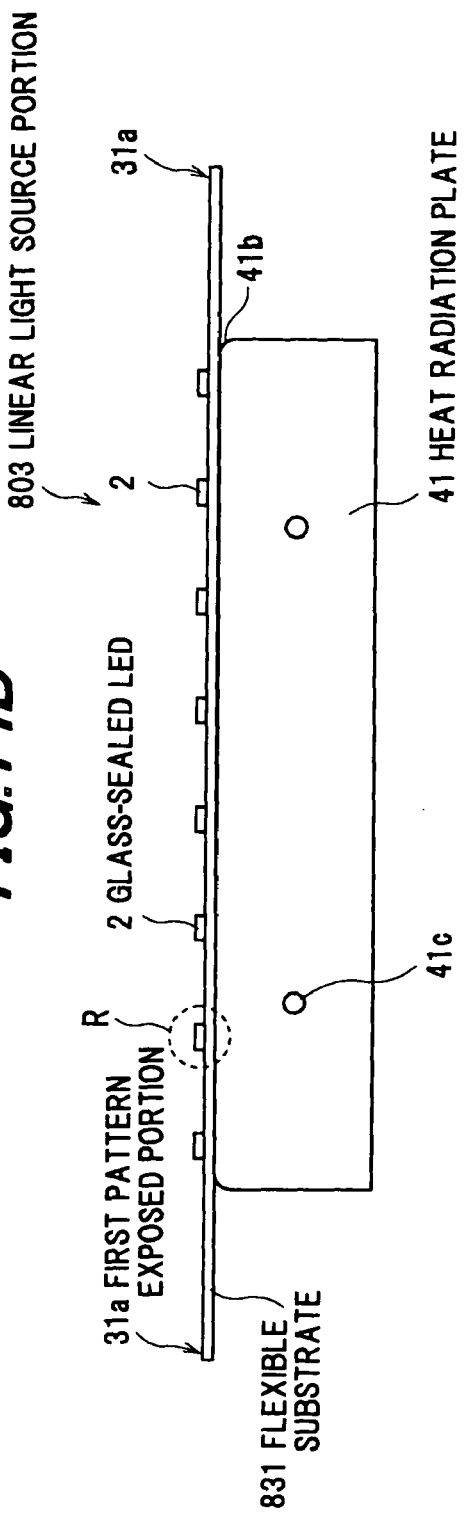

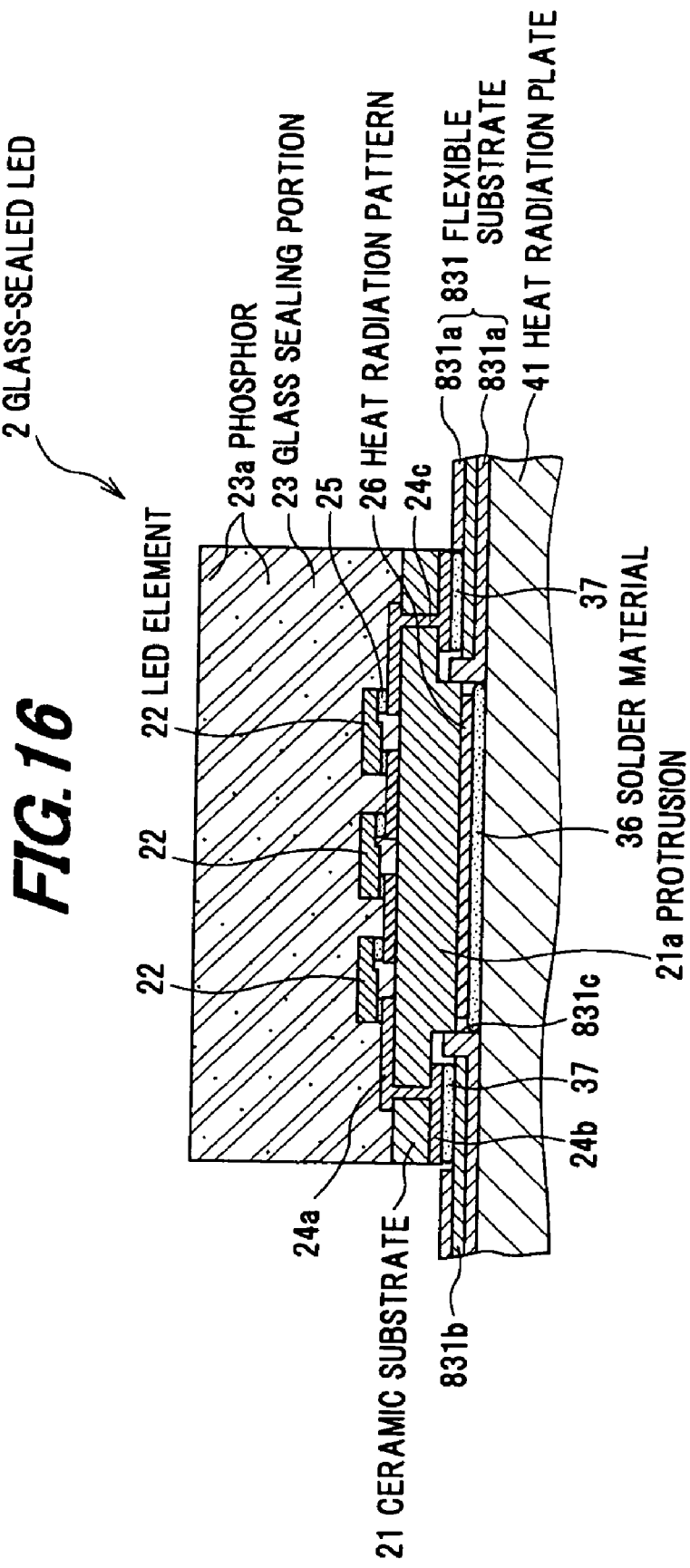

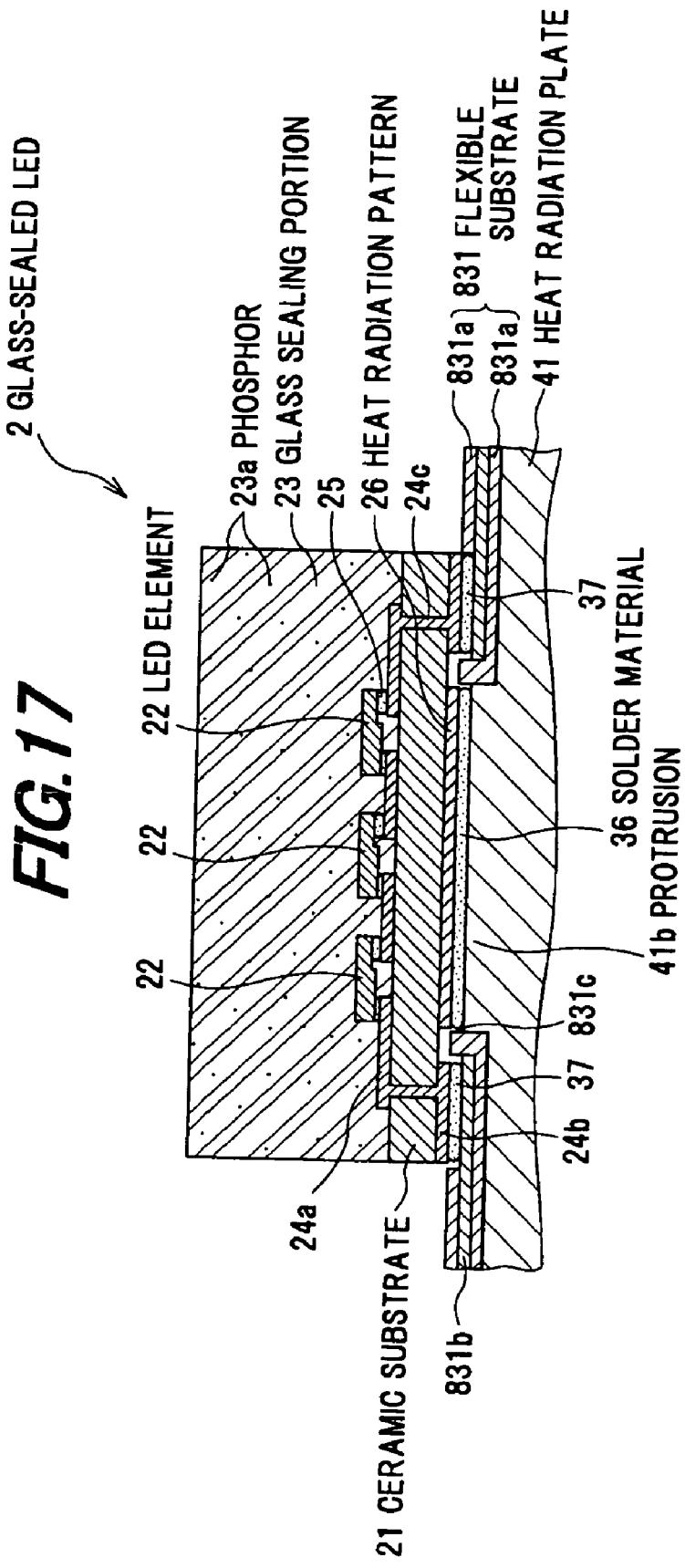

LIGHT SOURCE UNIT

The present application is based on Japanese patent application No. 2007-277833 filed on Oct. 25, 2007, the entire contents of which are incorporated herein by reference.

BACKGROUND OF THE INVENTION

1. Field of the Invention

This invention relates to a light source unit including a linear light source portion with plural glass-sealed LEDs (light emitting diodes) mounted thereon, and a heat radiation portion connected to the linear light source portion.

2. Description of the Related Art

A linear light source unit is known in which plural LED elements are mounted on an elongate wiring board and the LED elements are sealed with a resin sealing material on the wiring board (See, e.g., JP-A-2006-344450, paragraph [0005]). However, this linear light source unit has the problems that, due to heat generated from the LED elements, the resin sealing material is yellowed by deterioration to cause an reduction in light intensity with time, or the resin sealing material is separated from the wiring board to cause a contact failure.

In order to solve the problems, JP-A-2006-344450 discloses a linear light source unit that is composed of plural LED elements arranged on the wiring board, and a glass material formed on the wiring board for covering the LED elements (e.g., paragraph [0021]). JP-A-2006-344450 states that the glass material has thermal conductivity about five times higher than the conventional resin material and, therefore, amount of heat dissipated outside from the LED elements increases to suppress temperature rise of the LED elements.

However, since the thermal conductivity of the glass material and the resin material is much lower than that of a metal material etc., the heat radiation property of the sealing material of the linear light source unit of JP-A-2006-344450 is still insufficient though the glass material has thermal conductivity higher than the conventional resin material. In other words, the linear light source unit of JP-A-2006-344450 does not provide enough improvement in heat radiation property as compared to that the conventional linear light source unit with the resin sealing material, and the amount of heat from the LED elements acceptable in the entire unit is equal to the conventional linear light source unit with the resin sealing material. Thus, although the linear light source unit of JP-A-2006-344450 allows an increase in amount of heat from the LED elements by using the glass sealing material, thermal load is eventually applied to each LED element since the entire unit is problematic in the heat radiation property of the LED elements. Therefore, it is infeasible to improve the performance of the light source unit by increasing the light intensity of the LED elements or by densely arranging the LED elements since heat generation increases thereby. As a result, the performance of the LED elements cannot be sufficiently utilized.

SUMMARY OF THE INVENTION

It is an object of the invention to provide a light source unit that can sufficiently radiate heat generated from glass-sealed LED elements.

(1) According to one embodiment of the invention, a light source unit comprises:

a linear light source portion comprising a plurality of glass-sealed LEDs;

a heat radiation portion comprising a heat radiation plate connected to the linear light source portion; and a case including an outside wall that is disposed apart from the linear light source portion and the heat radiation portion, a support portion connecting the outside wall to heat radiation portion, and a vent hole formed in the outside wall.

In the above embodiment (1), the following modifications and changes can be made.

(i) The support portion comprises an incised part extending from the outside wall inside the case such that the vent hole is defined by the incised part.

(ii) The case has a thermal conductivity lower than the heat radiation portion.

(iii) The sidewall of the case comprises a pair of sidewalls parallel to the heat radiation portion, and the support portion and the vent hole are formed in at least one of the sidewalls.

(iv) The case comprises a bottom wall connected with the sidewalls, and the bottom wall supports an end portion of the heat radiation portion on an opposite side to the linear light source portion.

(v) The bottom wall supports the heat radiation portion at a position higher than a part where the bottom wall is connected with the sidewalls.

(vi) The heat radiation portion further comprises a reflection plate comprising a fixing portion fixed to the heat radiation portion and a reflection mirror portion extended apart from the linear light source portion in a lateral direction for reflecting light emitted from the linear light source portion.

(vii) The light source unit further comprises a lens secured to the outside wall of the case for optically controlling light emitted from the linear light source portion.

(viii) The heat radiation portion further comprises a reflection plate for reflecting light emitted from the plurality of glass-sealed LEDs, the case comprises a thermal conductivity lower than the heat radiation portion, and the reflection plate comprises a thermal conductivity between the case and the heat radiation portion.

BRIEF DESCRIPTION OF THE DRAWINGS

The preferred embodiments according to the invention will be explained below referring to the drawings, wherein:

FIG. 12 is a front view showing the light source unit in FIG. 11;

FIG. 13 is a side view showing the light source unit in FIG. 11;

FIG. 14A is a top view showing a linear light source portion in a third preferred embodiment according to the invention;

FIG. 14B is a side view showing the linear light source portion in FIG. 14A;

FIG. 16 is a cross sectional view showing a modification of the third embodiment; and FIG. 17 is a cross sectional view showing another modification of the third embodiment.

DETAILED DESCRIPTION OF THE PREFERRED EMBODIMENTS

First Embodiment

Figure 1:
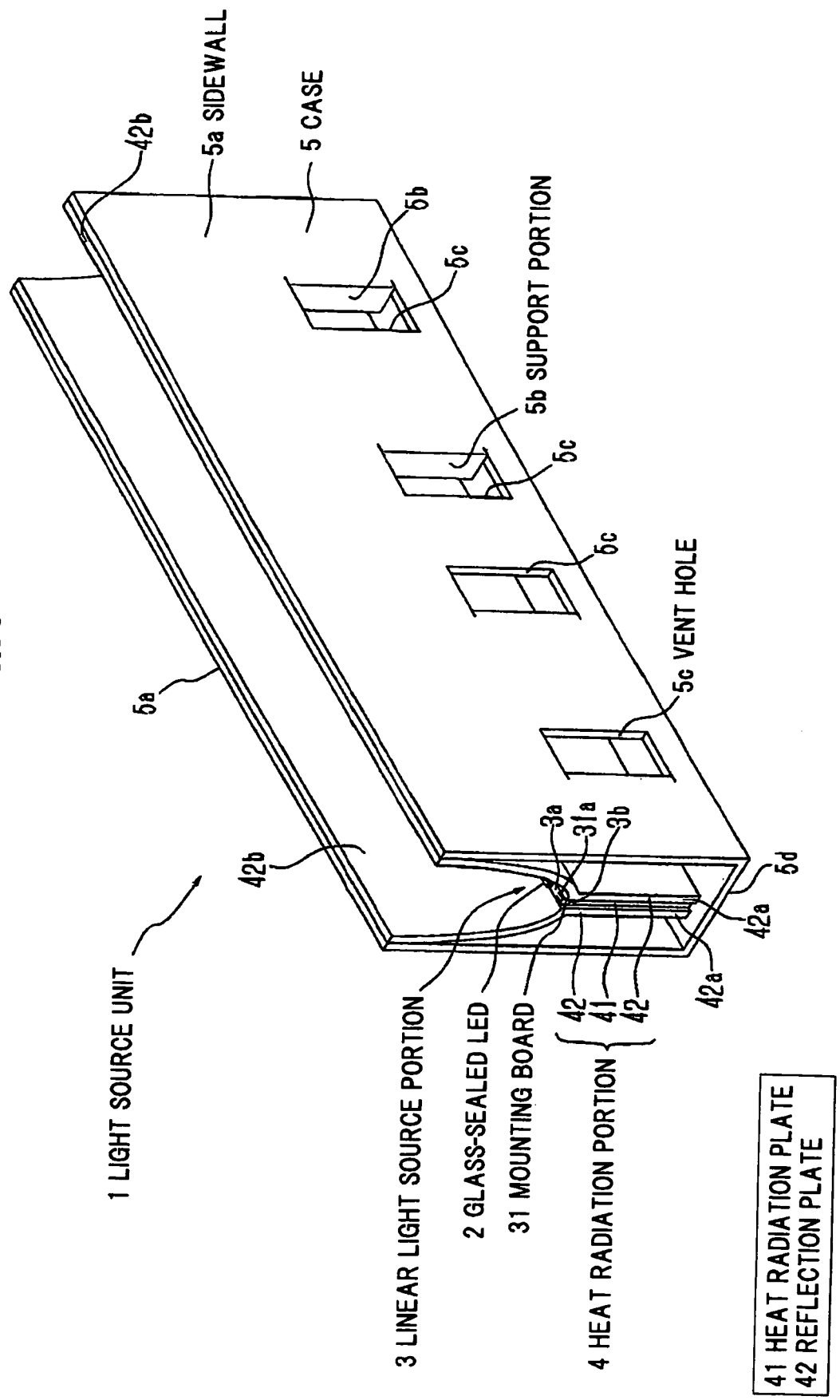
FIG. 1 is a perspective view showing a light source unit in a first preferred embodiment according to the invention.

FIGS. 1 to 8 show the first preferred embodiment of the invention and FIG. 1 is a perspective view showing a light source unit in the first embodiment.

As shown in FIG. 1, the light source unit 1 is composed of a linear light source portion 3 with plural glass-sealed LEDs 2 mounted on a top surface 3a thereof, a heat radiation portion 4 including a heat radiation plate 41 connected to a bottom surface 3b of the linear light source portion 3 and extending downward from the linear light source portion 3. The light source unit 1 is further composed of a case 5 that is composed of a pair of sidewalls 5a disposed a distance apart from and laterally outside the linear light source portion 3, a support portion 5b for connecting the sidewalls 5a to the heat radiation portion 4, a vent hole 5c formed in the sidewall 5a for laterally communicating between the inside and the outside of the sidewall 5a, and a bottom wall 5d connecting the lower ends of the sidewalls 5a and disposed a distance apart from the heat radiation portion 4.

Figure 2:
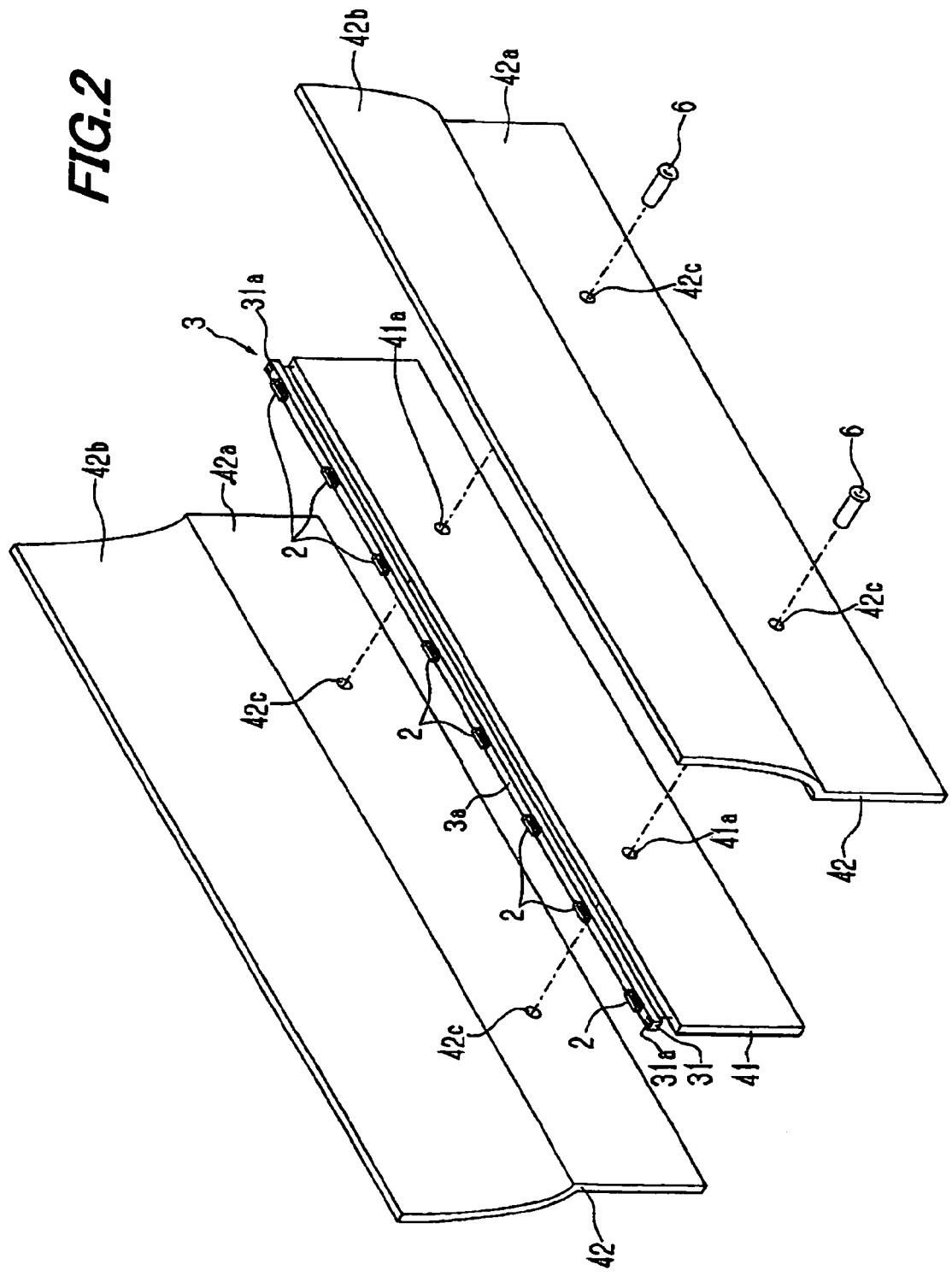
FIG. 2 is an exploded perspective view showing the light source unit in FIG. 1.

FIG. 2 is an exploded perspective view showing the light source unit in FIG. 1, where the case 5 is omitted for the sake of explanation.

As shown in FIG. 2, the heat radiation portion 4 is composed of the rectangular heat radiation plate 41 formed of metal and having both surfaces arranged in the vertical direction, and a pair of reflection plates 42 formed of metal. The reflection plates 42 are disposed outside the heat radiation plate 41 in the lateral direction. The heat radiation plate 41 is provided with an insertion hole 41a for inserting a rivet 6 therethrough, and the reflection plate 42 is provided with an insertion hole 42c for inserting the rivet 6 therethrough. The linear light source portion 3 has the same width (i.e., a length in the lateral direction) as the heat radiation plate 41, and is secured to the upper end face (or one side) of the rectangular heat radiation plate 41 via a soldering material 38 (See FIG. 4).

Figure 3:
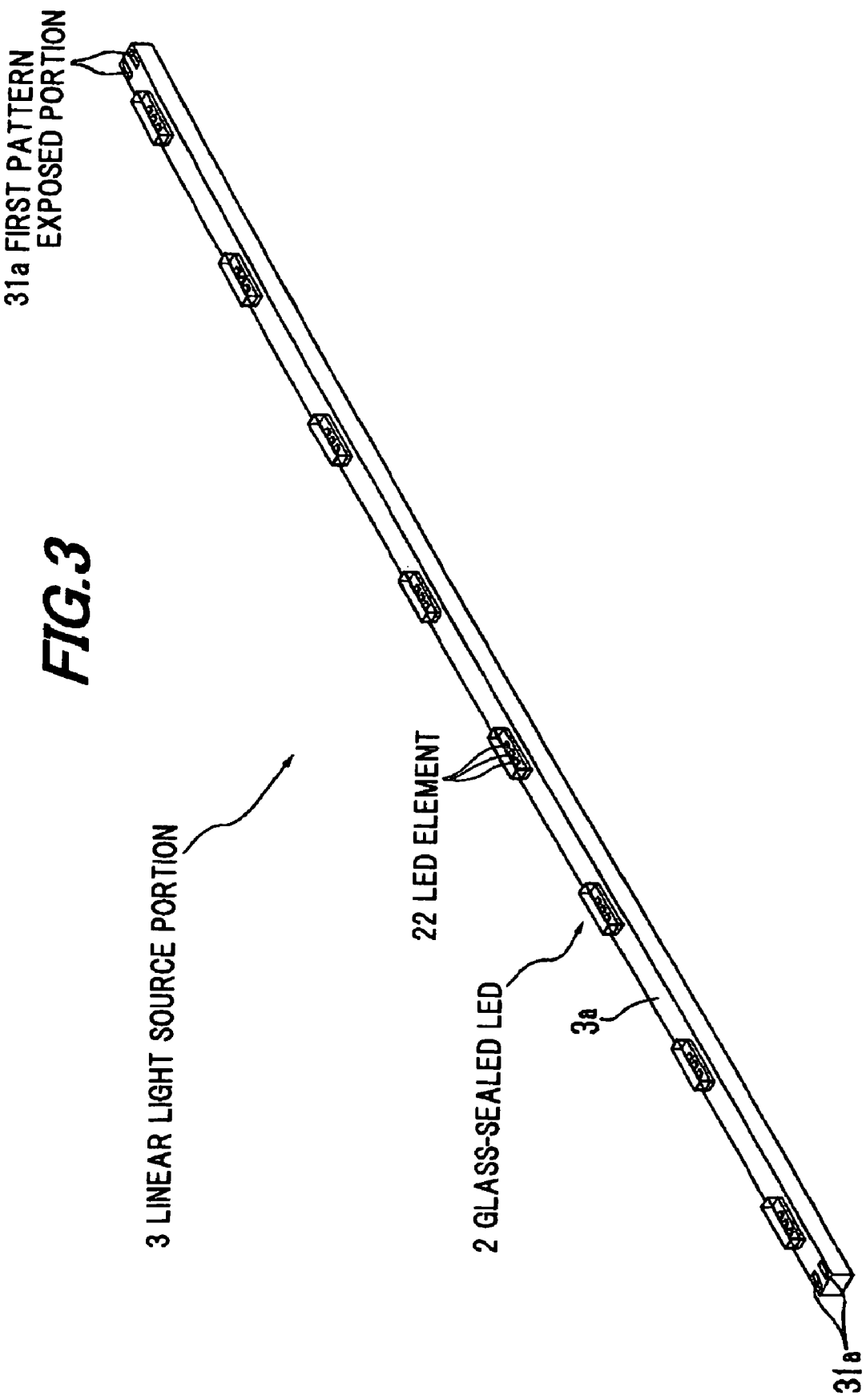
FIG. 3 is a perspective view showing a linear light source portion in FIG. 1.

FIG. 3 is a perspective view showing the linear light source portion in FIG. 1.

As shown in FIG. 3, the linear light source portion 3 is composed of a mounting board 31 elongated in the depth direction, and the plural glass-sealed LEDs 2 mounted in a row on the top surface 3a of the mounting board 31. In this embodiment, the eight glass-sealed LEDs 2 are mounted electrically connected in series. The glass-sealed LEDs 2 each include three LED elements 22 mounted on a ceramic substrate 21 and arranged in the depth direction, and the LED elements 22 are electrically connected in series. The LED elements 22 each emit light with a peak wavelength of 460 nm at forward voltage of 4.0 V and forward current of 100 mA. In the linear light source portion 3, since the twenty-four LED elements 22 are connected in series, about 4.0 V of forward voltage is applied to each of the LED elements 22 by using a domestic power supply of AC 100 V such that the LED elements 22 can be operated as expected.

Figure 4:
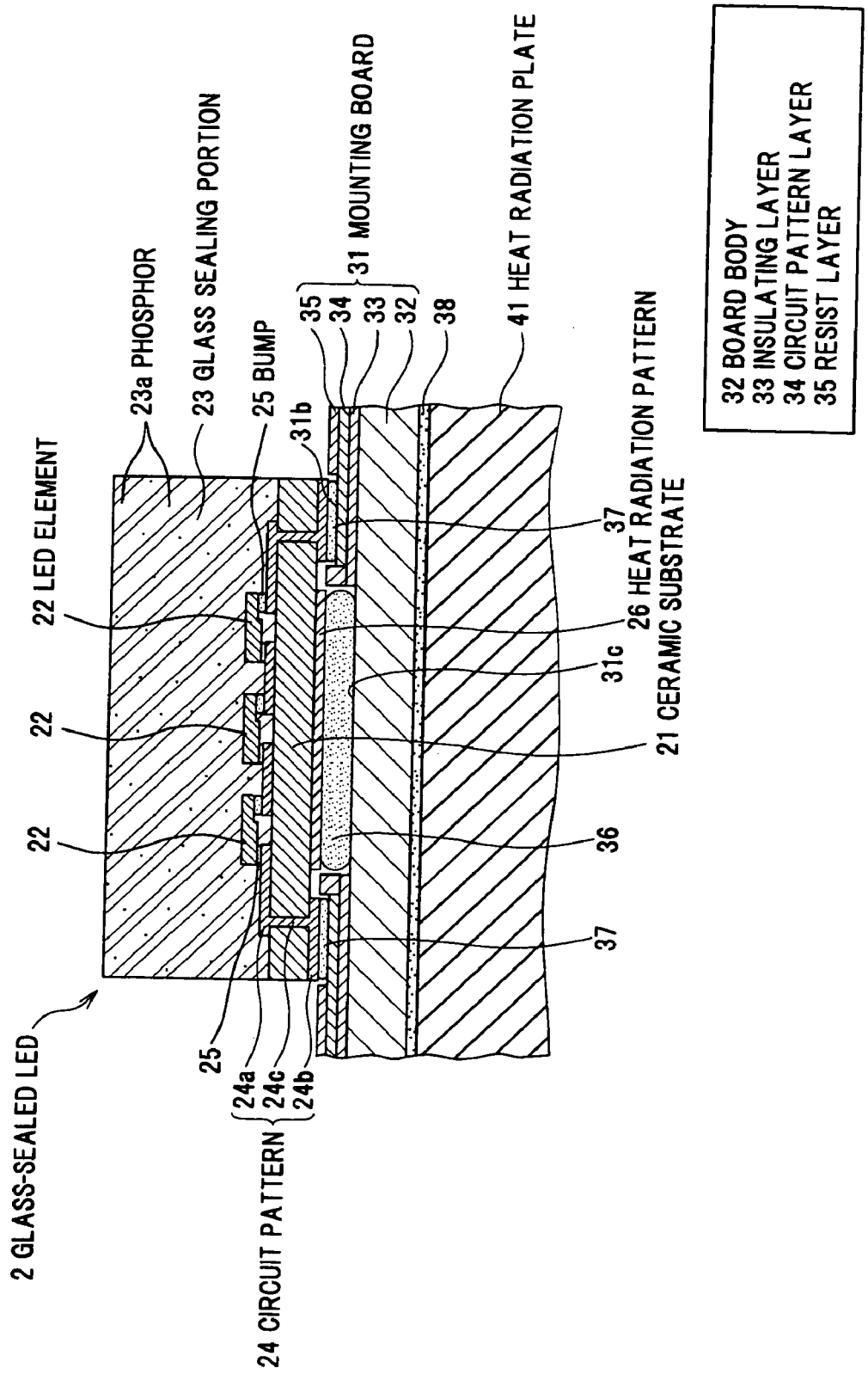
FIG. 4 is a cross sectional view showing a part of the linear light source portion.

FIG. 4 is a cross sectional view showing a part of the linear light source portion.

As shown in FIG. 4, the glass-sealed LED 2 is composed of the flip-chip type LED elements 22 formed of a GaN-based semiconductor material, the ceramic substrate 21 for mounting the LED elements 22 thereon, a circuit pattern 24 for supplying power to the LED elements 22 on the ceramic substrate 21, and a glass sealing portion 23 for sealing the LED elements 22 on the ceramic substrate 21.

The LED element 22 is composed of, on the surface of a growth substrate of GaN, an n-type layer, an MQW layer and a p-type layer formed of a group III nitride based semiconductor and epitaxially grown in this order. The LED element 22 is epitaxially grown at 700° C. or more, and has an upper temperature limit of 600° C. or more such that it is stable for process temperature during sealing by using low-melting point thermal fusion glass. The LED element 22 is provided with a p-side electrode formed on the p-type layer, a p-side pad electrode formed on the p-side electrode, and an n-electrode formed on a part of the n-type layer exposed by partially etching the p-type layer through the n-type layer. A bump 25 is formed on the p-side pad electrode and the n-side electrode. In this embodiment, the LED element 22 is 100 μm in thickness and 346 μm square in chip size.

The ceramic substrate 21 is formed of an alumina ($Al_2O_3$) polycrystalline sintered material, and it is 0.25 mm in thickness (i.e., a dimension in the vertical direction), 3.25 mm in length (i.e., a dimension in the longitudinal or lateral direction), and 0.9 mm in width (i.e., a dimension in the depth direction). As shown in FIG. 4, the circuit pattern 24 is composed of a upper pattern 24a formed on the top surface of the ceramic substrate 21 and electrically connected to the LED element 22, an electrode pattern 24b formed on the bottom surface of the ceramic substrate 21 and electrically connected to the mounting board 31, and a via pattern 24c electrically connecting the upper pattern 24a to the electrode pattern 24b. The electrode patterns 24b are formed at both ends of the ceramic substrate 21 in the longitudinal direction, and, of them, one is a positive electrode and the other is a negative electrode. A heat radiation pattern 26 is formed at the bottom of the ceramic substrate 21 and between the electrode patterns 24b.

The upper pattern 24a, the electrode pattern 24b and the heat radiation pattern 26 are each composed of a W (tungsten) layer formed on the surface of the ceramic substrate 21, a thin Ni plating layer covering the surface of the W layer, and a thin Ag plating layer covering the surface of the Ni plating layer. The via pattern 24c is formed of W and formed in a via hole penetrating through the ceramic substrate 21 in the thickness direction. In this embodiment, the electrode pattern 24b and the heat radiation pattern 26 are formed rectangular (in top view). The electrode pattern 24b is formed 0.4 mm in the longitudinal direction of the ceramic substrate 21, and 0.65 mm in the width direction of the ceramic substrate 21. The heat radiation pattern 26 is formed 1.8 mm in the longitudinal direction of the ceramic substrate 21, and 0.65 mm in the width direction of the ceramic substrate 21. The electrode pattern 24b and the heat radiation pattern 26 are 0.2 mm apart from each other in the longitudinal direction of the ceramic substrate 21. The heat radiation pattern 26 is formed directly under the LED elements 22 such that it overlaps (in top view) with the LED elements 22.

The glass sealing portion 23 is formed of $ZnO$—$Ba_2O_3$—$SiO_2$—$Nb_2O_5$—$Na_2O$—$Li_2O$ based thermal fusion glass. The thermal fusion glass is not limited to the above composition and may not include $Li_2O$ or may include as an optional element $ZrO_2$, $TiO_2$ etc. Alternatively, the glass sealing portion 23 may be formed of a sol-gel glass derived from a metal alkoxide. As shown in FIG. 4, the glass sealing portion 23 is formed a rectangular solid on the ceramic substrate 21, and has a height of 0.5 mm from the top surface of the ceramic substrate 21. The side face of the glass sealing portion 23 is formed such that a plate glass is bonded to the ceramic substrate 21 by hot pressing and is then cut together with the ceramic substrate 21 bonded thereto by using a dicer. The top surface of the glass sealing portion 23 forms a surface of the plate glass bonded to the ceramic substrate 21 by hot pressing. The thermal fusion glass is 490° C. in glass transition temperature (Tg), 520° C. in yielding point (At), $6 \times 10^{-6}$/°C. in thermal expansion coefficient ($\alpha$) at 100 to 300° C., and 1.7 in refractive index.

The glass sealing portion 23 contains phosphor 23a dispersed therein. The phosphor 23a is a yellow phosphor that emits yellow light with a peak wavelength in a yellow region by being excited by blue light emitted from the MQW layer. In this embodiment, the phosphor 23a is YAG (yttrium aluminum garnet). The phosphor 23a may be a silicate phosphor or a mixture of YAG and a silicate phosphor mixed at a predetermined ratio.

As shown in FIG. 4, the mounting board 31 is composed of a board body 32 of metal, an insulating layer 33 of a resin formed on the board body 32, a circuit pattern 34 of metal formed on the insulating layer 33, and a resist layer 35 of resin formed on the circuit pattern 34.

The board body 32 is formed of, e.g., copper (with a thermal conductivity of 380 $W \cdot m^{-1} \cdot K^{-1}$) and bonded via a soldering material 36 to the heat radiation pattern 26 of the glass-sealed LED 2. The insulating layer 33 is formed of, e.g., a polyimide resin or epoxy resin and serves to insulate the circuit pattern 34 from the electrically conductive board body 32. The circuit pattern 34 is formed of, e.g., copper with thin film gold formed on the top surface thereof, and electrically connected through the soldering material 37 to the electrode pattern 24b of the glass-sealed LED 2. The resist layer 35 is formed of, e.g., an epoxy based resin with a filler of titanium oxide, and white-colored. Thereby, the reflectivity of the upper surface 3a of the linear light source portion 3 can be enhanced.

Figure 5:
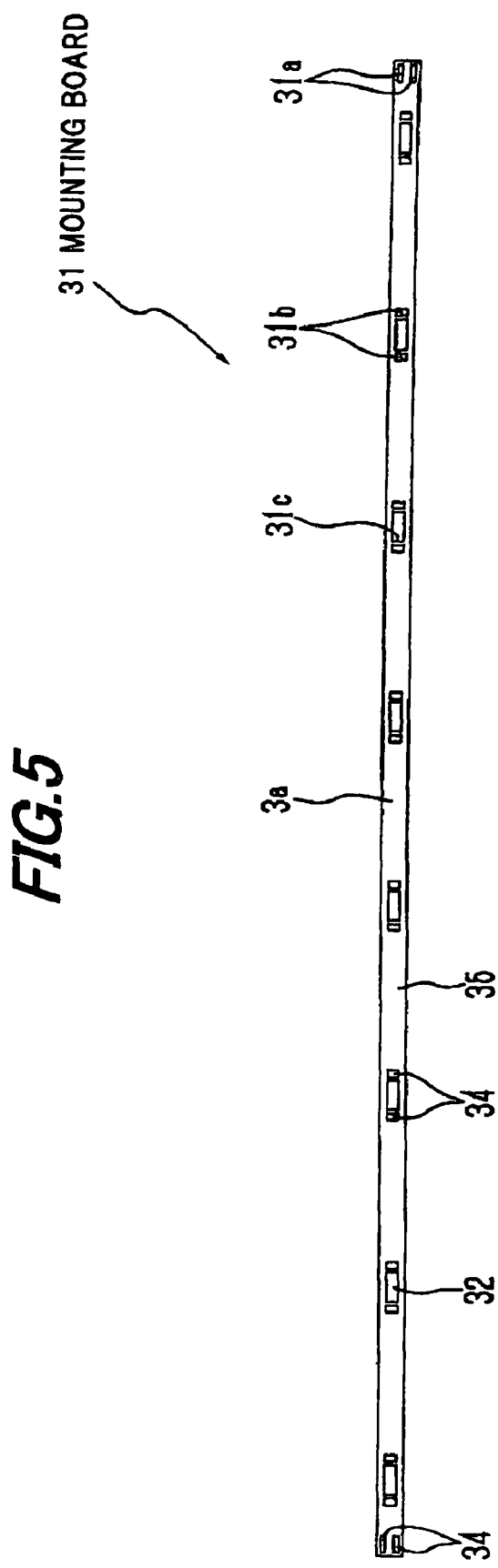
FIG. 5 is a top view showing a mounting board in FIG. 1.

FIG. 5 is a top view showing the mounting board in FIG. 1.

The mounting board 31 is formed 89.5 mm in length, 1.0 mm in width, and 1.0 mm in thickness. Namely, the mounting board 31 is slightly in width greater than the glass-sealed LED 2 mounted on the top surface 3a thereof. As shown in FIG. 5, the mounting board 31 is provided with a first pattern exposed portion 31a where the circuit pattern 34 is exposed at both ends thereof in the longitudinal direction. In this embodiment, a pair of the first pattern exposed portions 31a are formed, apart from each other in the width direction, at both ends of the mounting board 31 in the longitudinal direction. The first pattern exposed portions 31a are formed rectangular and extended in the longitudinal direction.

The mounting board 31 is further provided with a second pattern exposed portion 31b where the circuit pattern 34 is exposed and a heat radiation exposed portion 31c where the board body 32 is exposed, at a site for mounting the glass-sealed LED 2. The second pattern exposed portion 31b is formed corresponding to the electrode pattern 24b of the glass-sealed LED 2, and the heat radiation exposed portion 31c is formed corresponding to the heat radiation pattern 26 of the glass-sealed LED 2. The heat radiation exposed portion 31c is at the center of the mounting board 31 in the width direction and extended in the longitudinal direction, and the pair of the second pattern exposed portions 31b are disposed outside the heat radiation exposed portion 31c in the longitudinal direction. The heat radiation exposed portion 31c and the second pattern exposed portion 31b are formed with the same size (in top view) as the heat radiation pattern 26 and the electrode pattern 24b, respectively, of the glass-sealed LED 2. In this embodiment, the distance between the centers of the adjacent heat radiation exposed portion 31c is 11.5 mm, and the distance between the center of the heat radiation exposed portions 31c at both ends of the mounting board 31 in the longitudinal direction and the end of the mounting board 31 in the longitudinal direction is 4.5 mm.

Figure 6:
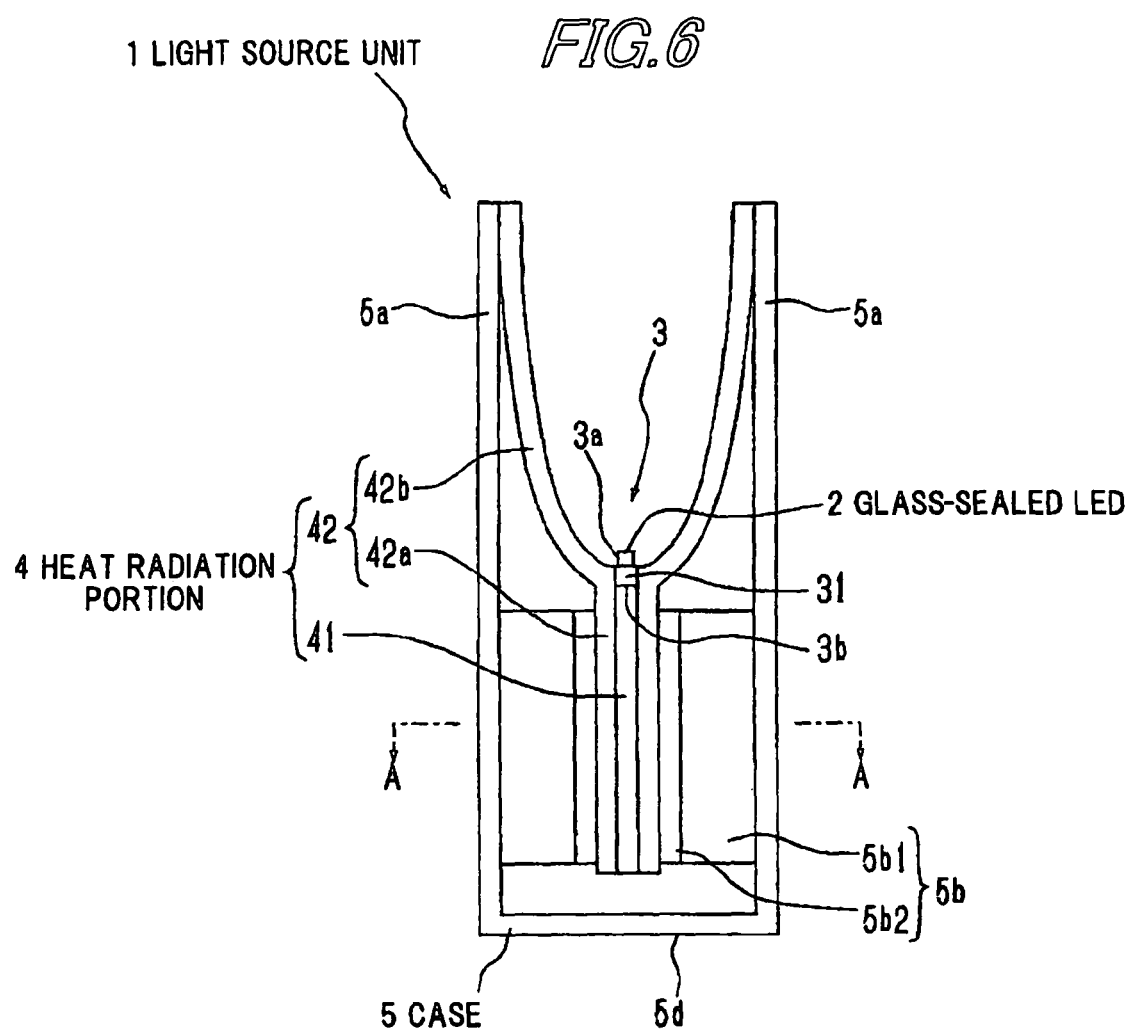
FIG. 6 is a front view showing the light source unit.

FIG. 6 is a front view showing the light source unit.

As shown in FIG. 6, the heat radiation plate 41 of the heat radiation portion 4 is in thickness (or in dimension in the lateral direction) the same as the mounting board 31 such that the mounting board 31 has a common side face with the heat radiation plate 41. For example, the heat radiation plate 41 is 1.0 mm in thickness. The mounting board 31 and the heat radiation plate 41 are bonded to each other via the soldering material 38 (See FIG. 4). The bottom end of the heat radiation plate 41 is apart from the bottom wall 5d of the case 5. In this embodiment, the heat radiation plate 41 is formed of copper.

The reflection plate 42 is formed of aluminum (with a thermal conductivity of 200 $W \cdot m^{-1} \cdot K^{-1}$) and 0.5 mm in thickness. The reflection plate 42 is composed of a fixing portion 42a fixed to the side of the heat radiation plate 41, and a reflection mirror portion 42b formed continuously with the fixing portion 42a and extending in the direction apart from the linear light source portion 3 to reflect light radiated from the linear light source portion 3. In this embodiment, the reflection mirror portion 42b extends inclined outward in the lateral direction and obliquely upward from the upper end of the fixing portion 42a. The fixing portion 42a is plate-shaped, an upper end thereof is the same level as the top face of the mounting board 31, and a lower end thereof is the same level as the bottom of the heat radiation plate 41. The reflection plates 42 are secured to the heat radiation plate 41 by the rivets 6 such that the inside face thereof is contacted with the mounting board 31 and the heat radiation plate 41.

The reflection plate 42 is provided with an inside surface that is formed parabolic (in front view) defining a focal point at the LED elements 22 of the glass-sealed LED 2. Thereby, of light radiated from the glass-sealed LED 2, light component inputted to the inside face of the reflection plate 42 is reflected upward. The upper end of the reflection mirror portion 42b is at the same level as the upper end of the sidewall 5a of the case 5. In this embodiment, the upper end of the outer face of the reflection mirror portion 42b is contacted with the upper end of the sidewall 5a of the case 5.

The case 5 is formed of a material with a thermal conductivity smaller than the heat radiation portion 4. The case 5 is formed of, e.g., a stainless steel (with a thermal conductivity of 25 $W \cdot m^{-1} \cdot K^{-1}$), and it is composed of the sidewalls 5a as a pair of outside walls for covering the outside of the linear light source portion 3 and the heat radiation portion 4 in the width direction, and the bottom wall 5d as an outside wall for covering the bottom side of the linear light source portion 3 and the heat radiation portion 4 and connecting the lower end of the sidewalls 5a.

Figure 7:
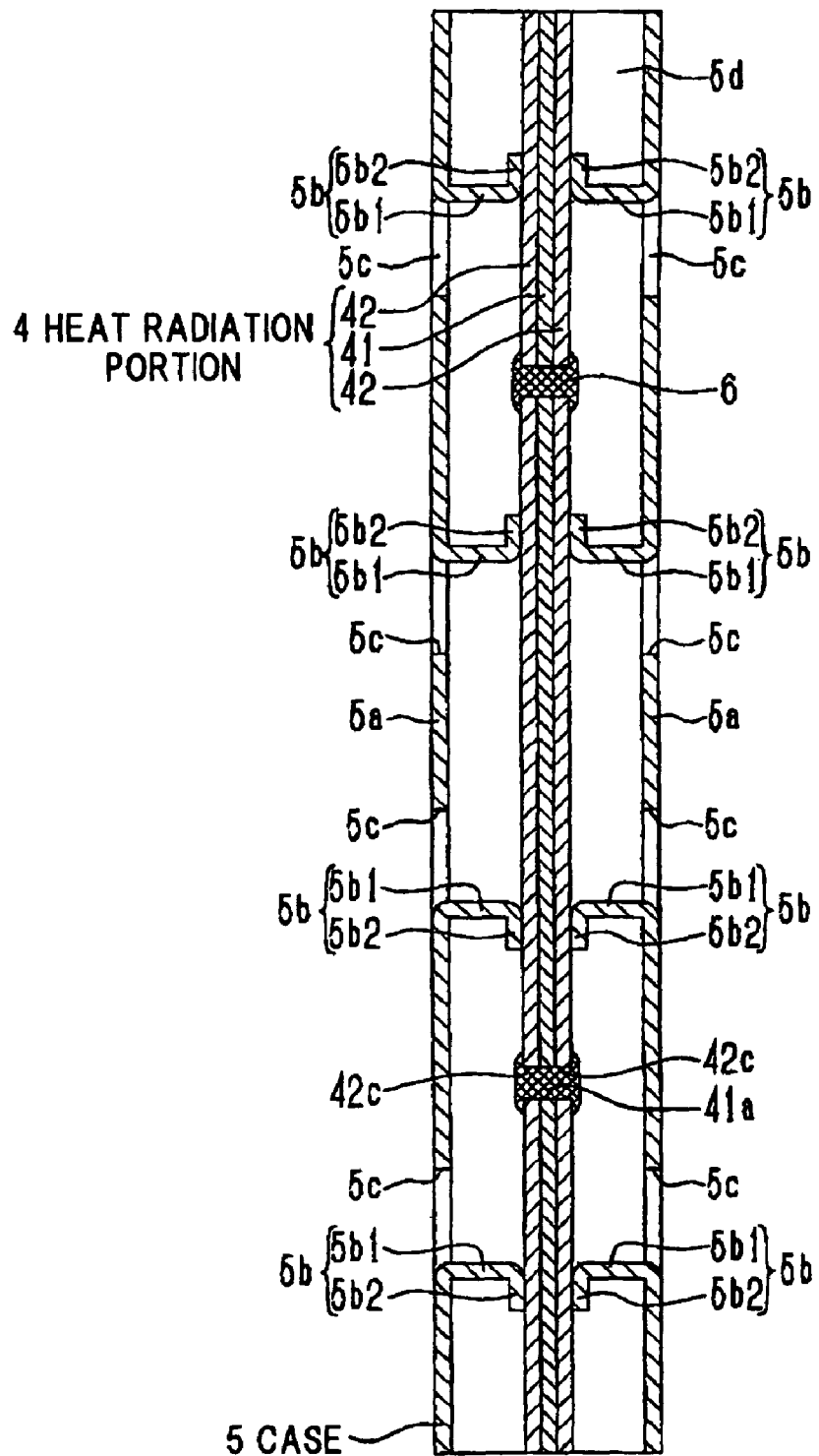
FIG. 7 is a cross sectional view cut along a line A-A in FIG. 6.

FIG. 7 is a cross sectional view cut along a line A-A in FIG. 6.

As shown in FIG. 7, by bending inward a part of the sidewall 5a in the width direction, the plural support portions 5b for connecting the sidewall 5a to the heat radiation portion 4 are formed. The support portion 5b is composed of an extension portion 5b1 extending inward from the sidewall 5a in the width direction, and a contact portion 5b2 extending from the end of the extension portion 5b1 in the depth direction. In this embodiment, the four contact portions 5b2 in total are formed at intervals in the depth direction on one sidewall 5a, where the contact portion 5b2 of the two support portions 5b positioned forward from the center in the depth direction extends forward, and the contact portion 5b2 of the two support portions 5b positioned backward from the center in the depth direction extends backward. The one support portion 5b is provided for the two glass-sealed LEDs 2 and connected to the heat radiation portion 4 at the middle of the two glass-sealed LEDs 2 in the depth direction.

Figure 8:
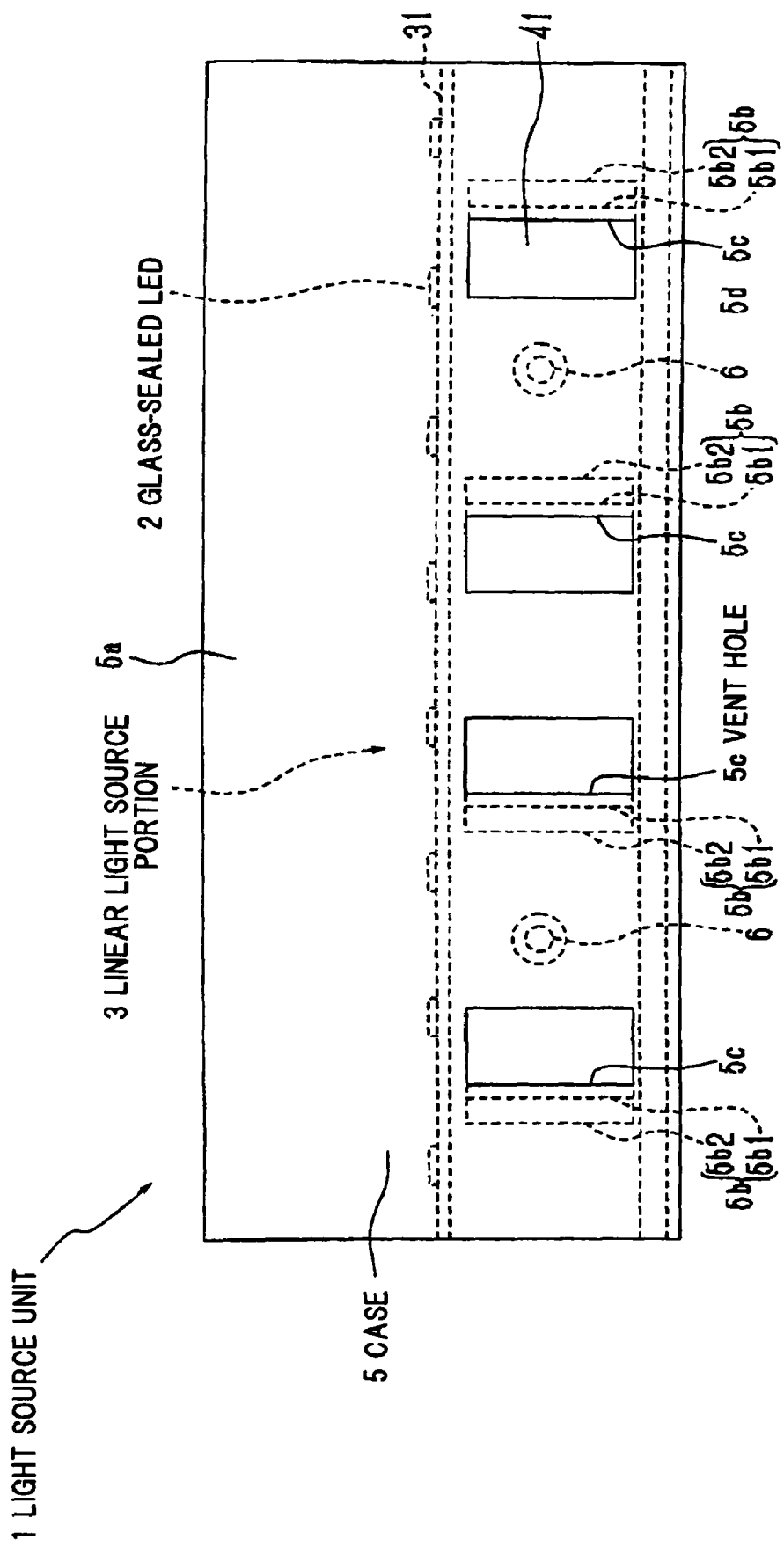
FIG. 8 is a side view showing the light source unit.

FIG. 8 is a side view showing the light source unit.

As shown in FIG. 8, the support portion 5b is formed in the vertical direction shorter than the fixing portion 42a of the reflection plates 42 such that it supports the heat radiation portion 4 centrally in the vertical direction. The sidewall 5a is provided with the vent hole 5c in conjunction with the formation of the support portion 5b. The vent hole 5c is formed rectangular elongating in the vertical direction.

The light source unit 1 thus composed operates such that the LED elements 22 of the glass-sealed LED 2 emits blue light when a voltage is applied to the first pattern exposed portion 31a of the linear light source portion 3. Then, a part of blue light is converted into yellow light by the phosphor 23a, so that white light based on a combination of blue light and yellow light can be radiated from the glass-sealed LEDs 2. The glass-sealed LEDs 2 are linearly arranged on the mounting board 31 in the longitudinal direction (i.e., in the depth direction in FIG. 6) and, therefore, the linear light source portion 3 can produce luminescence in linear form. In this embodiment, since the plural LED elements 22 are also arranged in the longitudinal direction inside the glass-sealed LED 2, the entire unit including the linear light source portion 3 etc. can be low-profile in the with direction (as shown in FIG. 6).

Of white light outputted from the glass-sealed LED 2, light component inputted to the inside surface of the reflection plate 42 can be reflected upward by the inside surface. Thus, white light can be outputted from the light source unit 1 with a predetermined width in the lateral (or width) direction. Although a small amount of white light outputted from the glass-sealed LED 2 may be inputted to the mounting board 31, it can be reflected upward by the white resist layer 34 formed thereon so that optical loss occurs little.

If the LED is sealed with resin as in the conventional LED, deterioration such as yellowing of the resin by heat as well as light occurs such that it causes a reduction in light intensity or a color change with time. In addition, due to the large thermal expansion coefficient ($\alpha$) (e.g., 150 to 200×10$^{-6}$/° C. in case of silicone) of the resin sealant, expansion or contraction by a change in temperature may cause disconnection at an electrical connection site of the LED element.

In contrast, the glass sealing material in this embodiment does not cause deterioration by light and heat, and the thermal expansion coefficient thereof is relatively close to that of the LED element 22 such that electrical disconnection does not occur. The glass is not limited to the low-melting point glass and may be a sol-gel glass derived from a metal alkoxide.

Heat generated at the LED elements 22 of the glass-sealed LED 2 is transferred through the heat radiation pattern 26 to the board body 32. Here, the LED elements 22 of the glass-sealed LED 2 are placed directly on the region where the heat radiation pattern 26 is formed, and they are bonded to the board body 32 at the region without any insulating layer having a large thermal resistance therebetween. Therefore, heat generated at the LED elements 22 can be surely transferred from the heat radiation pattern 26 to the board body 32. Then, heat transferred to the board body 32 is further transferred to the heat radiation plate 41 of the heat radiation portion 4. The board body 32 and the heat radiation plate 41 are both formed of copper relatively high in thermal conductivity and bonded to each other via a metal material such that heat can be smoothly transferred between them. Heat transferred to the heat radiation plate 41 is further transferred to the reflection plates 42 such that it can be radiated in the air from the surface of the reflection plates 42.

The reflection plates 42 is provided with the reflection mirror portion 42b for optical control in addition to the fixing portion 42a contacted with the heat radiation plate 41. Thereby, the contact area between the heat radiation portion 4 and the air can be increased to enhance the heat radiation effect.

Further, since the sidewall 5a of the case 5 is provided with the vent hole 5c, the air can be freely moved between the inside and the outside of the sidewall 5a such that heat exchange between the heat radiation portion 4 and the air can be promoted thereby.

Here, the surfaces of the heat radiation plate 41 are arranged perpendicular to the width (or lateral) direction of the linear light source portion 3 such that the space for heat radiation can be assured in the case 5 without increasing the dimension of the light source unit 1 in the width direction. Thus, the entire unit can be low-profile in the width direction while assuring the desired heat radiation property.

In the light source unit 1 of this embodiment, the heat radiation property of the linear light source portion 3 can be significantly enhanced without exposing the heat radiation portion 4 such that heat generated from the LED elements 22 arranged in a row can be surely radiated. Therefore, even when the construction is changed to increase the amount of heat generation such that the light intensity of the LED elements 22 increases or the LED elements 22 are arranged densely, the performance of the LED elements 22 can be sufficiently brought out.

If the heat radiation plate 41 is not used, the temperature of the LED elements 22 may rise such that the reliability is affected thereby. Temperature that may affect the reliability is, e.g., more than 150° C. or more than 200° C. although it depends on the LED element 22. The emission efficiency of the LED element 22 lowers as temperature rises and, therefore, stable light intensity cannot be obtained when the temperature of the LED element 22 increases excessively. Even if trying to get the heat radiation property by only the mounting board 31, the heat radiation area must be reduced since the thickness of the mounting board 31 is limited (e.g., to about twice the width) by the requirements for production. Therefore, current fed to the LED elements 22 is limited such that it is impossible to have a large light intensity.

In this embodiment, by using the heat radiation plate 41, it is possible to have a large light intensity without affecting the reliability of the LED elements 22. The heat radiation plate 41 is at high temperature in the range of not affecting the reliability of the LED elements 22, and the heat radiation property can be obtained by the difference from the atmosphere temperature.

Further, since the linear light source portion 3 with the electrode patter 42b is connected to the end face of the heat radiation plate 41, the electrode pattern 42b only has to be changed, e.g., in order to have a desired light intensity. This advantage cannot be obtained by the case that the LED elements 22 are simply mounted on the heat radiation plate 41.

The sidewalls 5a of the case 5 are disposed apart from the linear light source portion 3 such that heat is not directly transferred from the linear light source portion 3. Although the fixing portion 42a of the reflection plate 42 is connected to the sidewall 5a via the support portion 5b, heat transfer from the reflection plates 42 to the sidewall 5a can be suppressed since the support portion 5b is formed of stainless steel in heat conductivity lower than the reflection plates 42. Therefore, the temperature rise of the case 5 can be suppressed such that it is safe to hold the case 5 directly with hand.

The support portion 5b is used to connect the sidewall 5a of the case 5 to the heat radiation portion 4, so that the heat radiation portion 4 can be positioned to the sidewalls 5a in the lateral direction. In addition, the support portion 5b is formed by bending a part of the sidewall 5a, so that the number of components can be reduced and the case 5 can be made easy for reducing the manufacturing cost.

Modifications 1, 2

Although in the first embodiment the lower end of the heat radiation portion 4 is apart from the bottom wall 5d of the case 5, alternatively, the lower end of the heat radiation portion 4 may contact the bottom wall 5d of the case 5 such that the heat radiation portion 4 can be positioned relative to the case 5 in the vertical direction.

Figure 9:
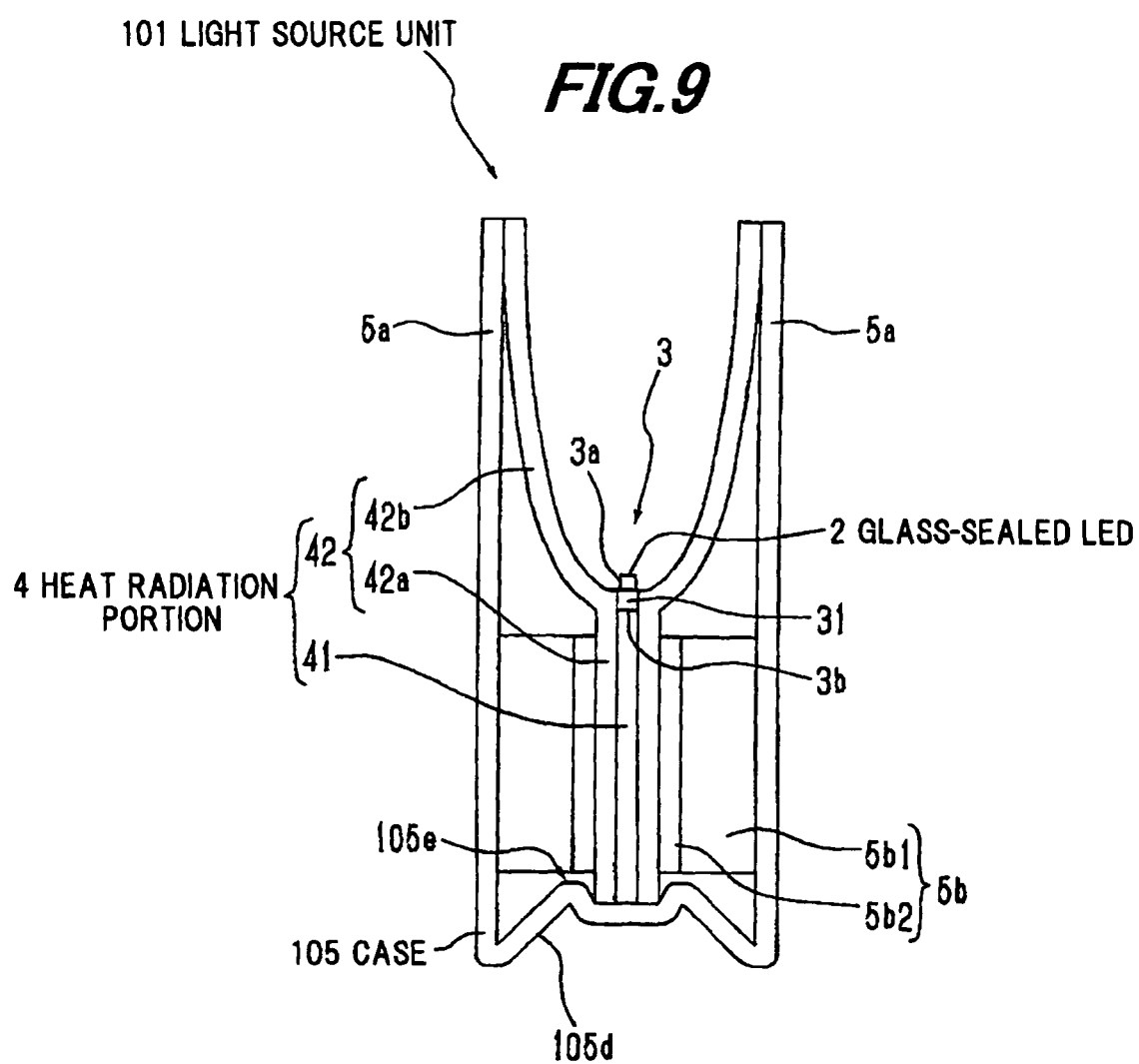
FIG. 9 is a front view showing a modification of the first embodiment.
Figure 10:
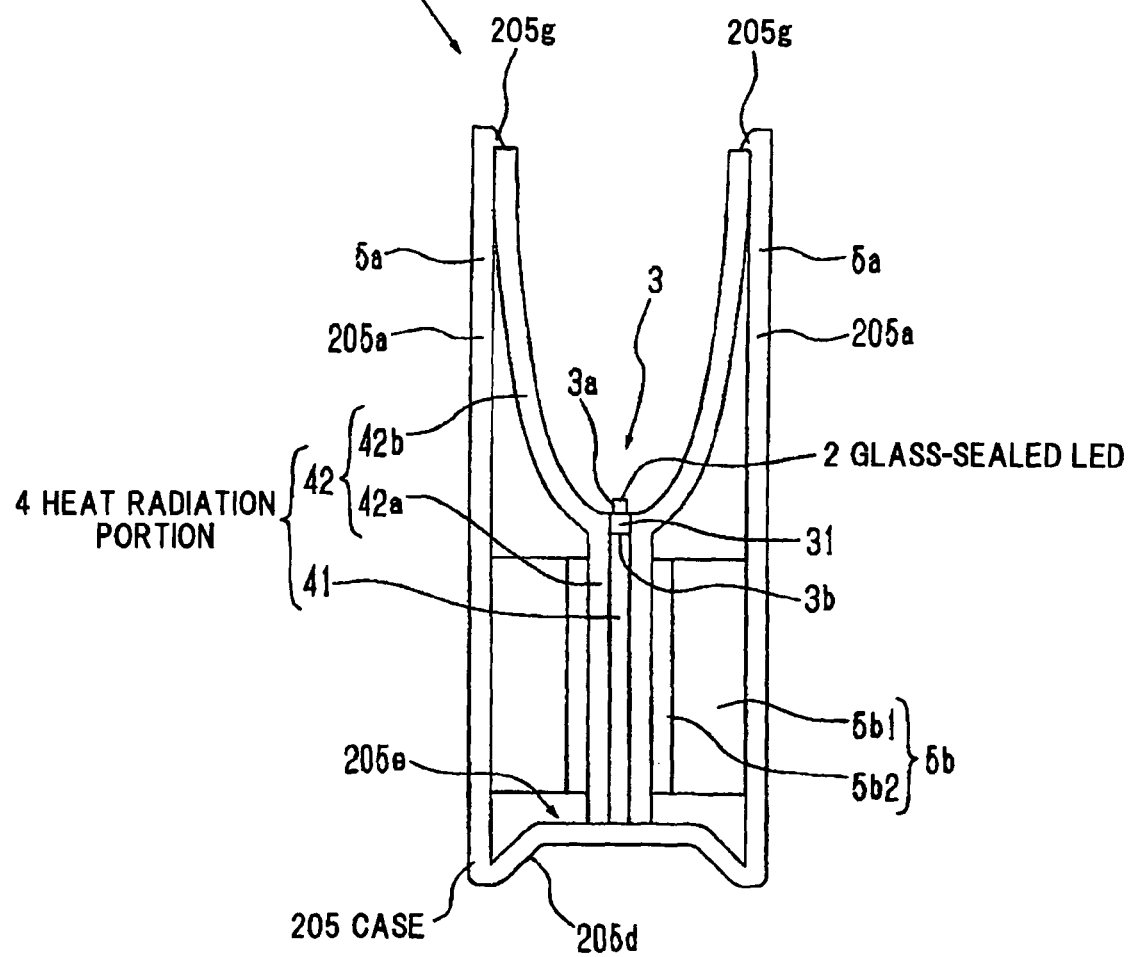
FIG. 10 is a front view showing another modification of the first embodiment.

FIGS. 9 and 10 are front views showing modifications 1 and 2, respectively, of the first embodiment.

As shown in FIG. 9, a light source unit 101 is different from the light source unit 1 of the first embodiment in relation to a shape of a bottom wall 105d of the case 5. As shown, the bottom wall 105d of the light source unit 101 is formed such that a support portion 105e for the heat radiation plate 41 is above the connection part of the bottom wall 105d to the sidewall 5a. The bottom wall 105d is provided with the groove-shaped support portion 105e on the top surface in the depth direction for receiving the heat radiation portion 4. Although the bottom wall 105e of the support portion 105d is likely to conduct heat since it contacts directly the heat radiation portion 4, it is placed higher than the other part of the bottom wall 105d such that it is difficult to access from the outside of the case 5.

On the other hand, as shown in FIG. 10, a light source unit 201 also has a bottom wall 205d formed such that a support portion 205e for the heat radiation plate 41 is above the connection part of the bottom wall 205d to the sidewall 5a. The bottom wall 205d is provided with the flat support portion 205e on the top surface in the depth direction for contacting the heat radiation portion 4. Further, the case 5 is provided, at the top end of the sidewall 5a, with a claw portion 205g projecting inward in the width direction. The lower face of the claw portion 205g is tapered inclined downward and laterally inward. The inner face (or bottom face) of the claw portion 205g contacts the top end face of the reflection mirror portion 42b of the reflection plates 42.

The light source unit 201 is assembled such that the heat radiation portion 4 with the linear light source portion 3 mounted thereon is inserted in the case 5 while expanding the sidewalls 5a in elastic deformation and contacting the outer surface of the reflection mirror portion 42b with the claw portion 205g, and the bottom end of the heat radiation portion 4 is placed to contact the support portion 205e. Then, by moving the top end face of the heat radiation portion 4 below the tapered face of the claw portion 205g, the sidewalls 5a return to the original position by elastic force, where the top end face of the reflection plates 42 is restricted by the lower face of the claw portion 205g. Thus, the heat radiation portion 4 can be easy assembled into the case 5, and the heat radiation portion 4 can be surely positioned to the case 5. The inner face of the support portions 5b in the width direction is preferably tapered to facilitate the insertion of the heat radiation portion 4 into the case 5.

Second Embodiment

Figure 11:
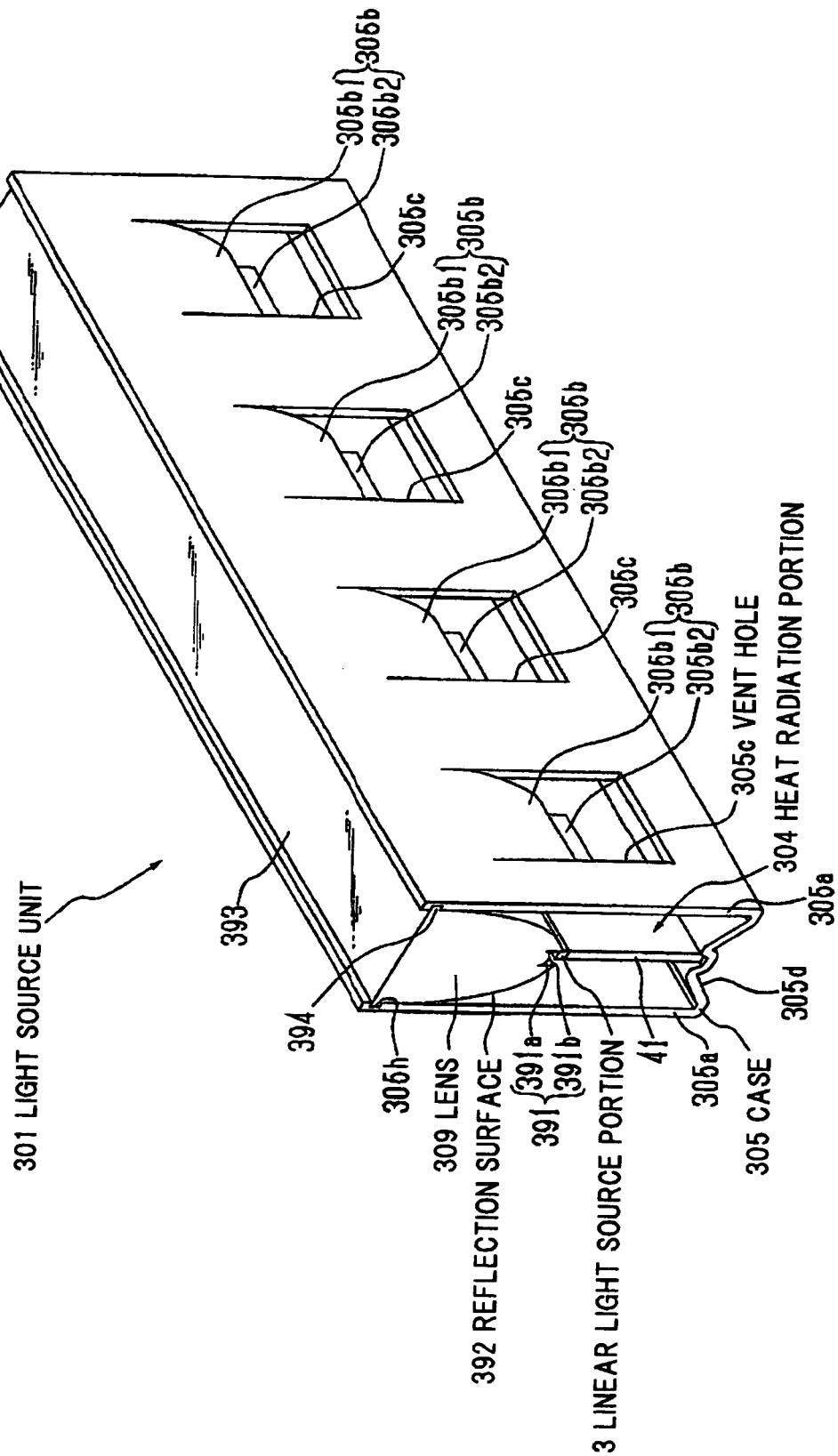
FIG. 11 is a perspective view showing a light source unit in a second preferred embodiment according to the invention.

FIGS. 11 to 13 show the second preferred embodiment of the invention, and FIG. 11 is a perspective view showing a light source unit in the second embodiment.

As shown in FIG. 11, the light source unit 301 is composed of the linear light source portion 3 with the plural glass-sealed LEDs 2 (not shown in FIG. 11) mounted on the top surface 3a, and a heat radiation portion 304 connected to the bottom face 3b of the linear light source portion 3 and extending downward from the linear light source portion 3.

The light source unit 301 is further composed of a case 305 that is composed of a pair of sidewalls 305a disposed a distance apart from and laterally outside the linear light source portion 3, a support portion 305b for connecting the sidewalls 305a to the heat radiation portion 304, a vent hole 305c formed in the sidewall 305a for laterally communicating between the inside and the outside of the sidewall 305a, and a bottom wall 305d connecting the lower ends of the sidewalls 305a and contacting the heat radiation portion 304.

The light source unit 301 is further composed of a lens 309 fixed to the sidewalls 305a of the case 305 for optically controlling white light radiated from the linear light source portion 3.

FIG. 12 is a front view showing the light source unit 301 in FIG. 11.

As shown in FIG. 12, in this embodiment, the heat radiation portion 304 is composed of only the heat radiation plate 41 and white light radiated from the linear light source portion 3 is optically controlled by the lens 309. The linear light source portion 3 and the heat radiation plate 41 are composed as in the first embodiment.

The lens 309 is formed of, e.g., acrylic resin and formed a cylindrical type extending along the longitudinal direction of the linear light source portion 3.

As shown in FIG. 12, the lens 309 is composed of an input portion 391 for inputting white light from the linear light source portion 3, a reflection surface 392 for reflecting light inputted into the lens 309 through the input portion 391, an output surface 393 for outputting light inside the lens 309 therethrough, and an engaging portion 394 engaged with the sidewall 305a of the case 305.

The input portion 391 is concaved upward at the bottom of the lens 309 so as to cover the upper side of the linear light source portion 3. The input portion 391 is composed of a curved surface 391a formed convex downward directly on the linear light source portion 3, and a pair of flat surfaces 391b extending downward from both ends of the curved surface 391a in the width direction. The reflection surface 392 is formed on both sides of the lens 309 in the lateral direction and formed parabolic (in front view) defining a focal point at the LED elements 22 of the glass-sealed LED 2. The engaging portion 394 is formed projecting outward in the lateral direction at the upper end of the reflection surface 392, and fitted with a concave portion 305h formed at the upper end of the sidewalls 305a of the case 305. The output face 393 is formed flat at the top of the lens 309. In this embodiment, the upper side of the case 305 is closed by the lens 309 and a closed section is formed by the lens 309, the sidewalls 305a and the bottom wall 305d.

The case 305 is formed of, e.g., a stainless steel (with a thermal conductivity of 25 $W \cdot m^{-1} \cdot K^{-1}$), and it is composed of the sidewalls 305a as a pair of outside walls for covering the outside of the linear light source portion 3 and the heat radiation portion 304 in the width direction, and the bottom wall 305d as an outside wall for covering the bottom side of the linear light source portion 3 and the heat radiation portion 304 and connecting the lower end of the sidewalls 305a. The bottom wall 305d is formed such that a support portion 305e for the heat radiation plate 41 is above the connection part of the bottom wall 305d to the sidewall 305a. The bottom wall 305d is provided with the groove-shaped support portion 305e on the top surface in the depth direction for receiving the heat radiation portion 304.

By bending inward a part of the sidewall 305a in the width direction, the plural support portions 305b for connecting the sidewall 305a to the heat radiation portion 304 are formed. The support portions 305b are each composed of an extension portion 305b1 extending inward from the sidewall 305a in the width direction, and a contact portion 305b2 extending downward from the end of the extension portion 305b1. The extension portion 305b1 is formed curved (in front view) and extends obliquely downward from the sidewall 305a.

FIG. 13 is a side view showing the light source unit in FIG. 11.

As shown in FIG. 13, the support portions 305b are formed at equal intervals in the depth direction. The one support portion 305b is provided for the two glass-sealed LEDs 2 and connected to the heat radiation portion 304 at the middle of the two glass-sealed LEDs 2 in the depth direction.

The sidewall 305a is provided with the vent hole 305c in conjunction with the formation of the support portion 305b. The vent hole 305c is formed rectangular elongating in the depth direction.

The light source unit 301 thus composed operates such that, when a voltage is applied to the first pattern exposed portion 31a of the linear light source portion 3, white light is radiated from the glass-sealed LEDs 2 so that the linear light source portion 3 can produce luminescence in linear form. In this embodiment, since the plural LED elements 22 are also arranged in the longitudinal direction inside the glass-sealed LED 2, the entire unit including the linear light source portion 3 etc. can be low-profile in the with direction (as shown in FIG. 12).

Of white light outputted from the glass-sealed LED 2, light component inputted to the reflection surface 392 of the lens 309 can be reflected upward by the reflection surface 392. Thus, white light can be outputted from the light source unit 301 with a predetermined width in the lateral (or width) direction.

Heat generated at the LED elements 22 of the glass-sealed LED 2 is transferred through the heat radiation pattern 26 to the board body 32. Here, the LED elements 22 of the glass-sealed LED 2 are placed directly on the region where the heat radiation pattern 26 is formed and, therefore, heat generated at the LED elements 22 can be surely transferred from the heat radiation pattern 26 to the board body 32. Then, heat transferred to the board body 32 is further transferred to the heat radiation plate 41 of the heat radiation portion 304. The board body 32 and the heat radiation plate 41 are both formed of copper relatively high in thermal conductivity such that heat can be smoothly transferred between them.

Further, since the sidewall 305a of the case 305 is provided with the vent hole 305c, the air can be freely moved between the inside and the outside of the sidewall 305a such that heat exchange between the heat radiation portion 304 and the air can be promoted thereby.

The sidewalls 305a of the case 305 are disposed apart from the linear light source portion 3 such that heat is not directly transferred from the linear light source portion 3. Although the heat radiation plate 41 is connected to the sidewall 305a via the support portion 305b, heat transfer from the heat radiation plate 41 to the sidewall 305a can be suppressed since the support portion 305b is formed of stainless steel in heat conductivity lower than the heat radiation plate 41. Therefore, the temperature rise of the case 305 can be suppressed such that it is safe to hold the case 305 directly with hand.

The support portion 305b is used to connect the sidewall 305a of the case 305 to the heat radiation portion 304, so that the heat radiation portion 304 can be positioned to the sidewalls 305a in the lateral direction. In addition, the support portion 305b is formed by bending a part of the sidewall 305a, so that the number of components can be reduced and the case 305 can be made easy for reducing the manufacturing cost.

In the first and second embodiments, the longitudinal, width and thickness directions of the linear light source portion 3 are expressed as the depth, lateral and vertical directions, respectively. However, the light source units 1, 301 can be used in arbitrary posture, e.g. a posture may be taken that light is outputted downward or horizontally.

In the above embodiments, both of the sidewalls 5a (or 305a) are provided with the support portions 5b (or 305b) and with the vent holes 5c (or 305c). However, one of the sidewalls 5a (or 305a) may be provided with them. When only one of the sidewalls 5a (or 305a) is provided with the support portions 5b (or 305b) and with the vent holes 5c (or 305c), the heat radiation portion 4 (or 304) may be positioned to the other of the sidewalls 5a (or 305a) by, e.g., a fastening member such as a screw. However, in view of the number of components or the assembly workability in the light source unit 1 (or 301), both of the sidewalls 5a (or 305a) are preferably provided with the support portions 5b (or 305b).

Further, in addition to the vent holes 5c (or 305c) formed by bending the support portion 5b (or 305b), the sidewalls 5a (or 305a) may be provided with another vent hole.

Further, when the bottom wall 5d of the case 5 is apart from the linear light source portion 3 and the heat radiation portion 4 as in the first embodiment, the bottom wall 5d may be provided with a support portion and a vent hole.

In the above embodiments, the cases 5, 305 are formed of stainless steel. Alternatively, they may be formed arbitrarily of another material such as resin. However, in view of the support portion 5b (or 305b) formed by bending the sidewall 5a (or 305a), the cases 5, 305 are preferably formed of a metal material. On the other hand, in view of the suppression of heat transfer from heat radiation portion, the case is formed of a material with thermal conductivity lower than the heat radiation portion.

In the above embodiments, the heat radiation plate 41 is formed of a copper plate. However, it may be formed of another metal plate such as an aluminum plate and brass plate. The heat radiation plate 41 may be in arbitrary form other than rectangular. The heat radiation portion 4 may be arbitrarily composed, e.g., a fin etc. connected the heat radiation plate 41. In brief, the heat radiation portion 4 only has to have at least the heat radiation plate 41 for mounting the linear light source portion 3 on its end face.

Although in the above embodiments the mounting board 31 is provided with the board body 32 as a copper base board, it may be provided with another metal base board such as a aluminum base board. Further, the mounting board 31 may be a flexible substrate of polyimide or liquid-crystal polymer, and it may be disposed between the glass-sealed LED 2 and the heat radiation plate 41. In case of using a relatively thin film substrate as the mounting board 31, from the viewpoint of heat radiation property, it is desirable that the substrate is provided with a hole corresponding to the heat radiation pattern 26 of the glass-sealed LED 2 and the heat radiation pattern 26 is directly bonded via solder etc. to the heat radiation plate 41. Here, in case of the insulating layer of the meal base substrate formed of copper or aluminum and the relatively thin film insulating portion formed of polyimide or liquid-crystal polymer, shape restrictions on forming the hole are few as compared to the case of a relatively thick insulating portion of a glass epoxy substrate etc. Thus, as in the above embodiments, the hole can be easy formed even corresponding to the heat radiation pattern of the relatively small glass-sealed LED 2, or the mounting board with a relatively small width.

Although in the above embodiments the glass-sealed LEDs 2 are electrically in series connected, they may be electrically in parallel connected. Further, although the glass-sealed LED 2 is bonded to the heat radiation plate 41 without any insulating layer therebetween, it may be bonded thereto via an insulating layer or flexible substrate, where restrictions such as current fed increase.

In the above embodiments, white light can be emitted from the glass-sealed LEDs 2. Alternatively, the glass sealing portion 23 may not contain phosphor 23*a* dispersed therein such that the glass-sealed LED emits blue light.

The LED elements 22 are flip-chip mounted therein and, alternatively, may be face-up mounted.

Although the three LED elements 22 are linearly mounted on one glass-sealed LED 2, the number and arrangement of the LED elements 22 mounted on one glass-sealed LED 2 can be selected arbitrarily.

Thus, the details of the glass-sealed LED such as components, emission color etc. may be changed suitably.

Although in the second embodiment the lens 309 is formed a cylindrical type with same cross section in the longitudinal direction, the optical control portion of the lens may be separately formed for each of the glass-sealed LEDs 2. For example, the optical control portion of the lens may be formed circular (in top view) for each of the glass-sealed LEDs 2. Although in the above embodiments the reflection mirror portion 42*b* of the reflection plates 42 and the reflection surface 309 of the lens 309 are both formed parabolic (in front view), they may be formed linear (in front or cross-sectional view).

Third Embodiment

Figure 15:
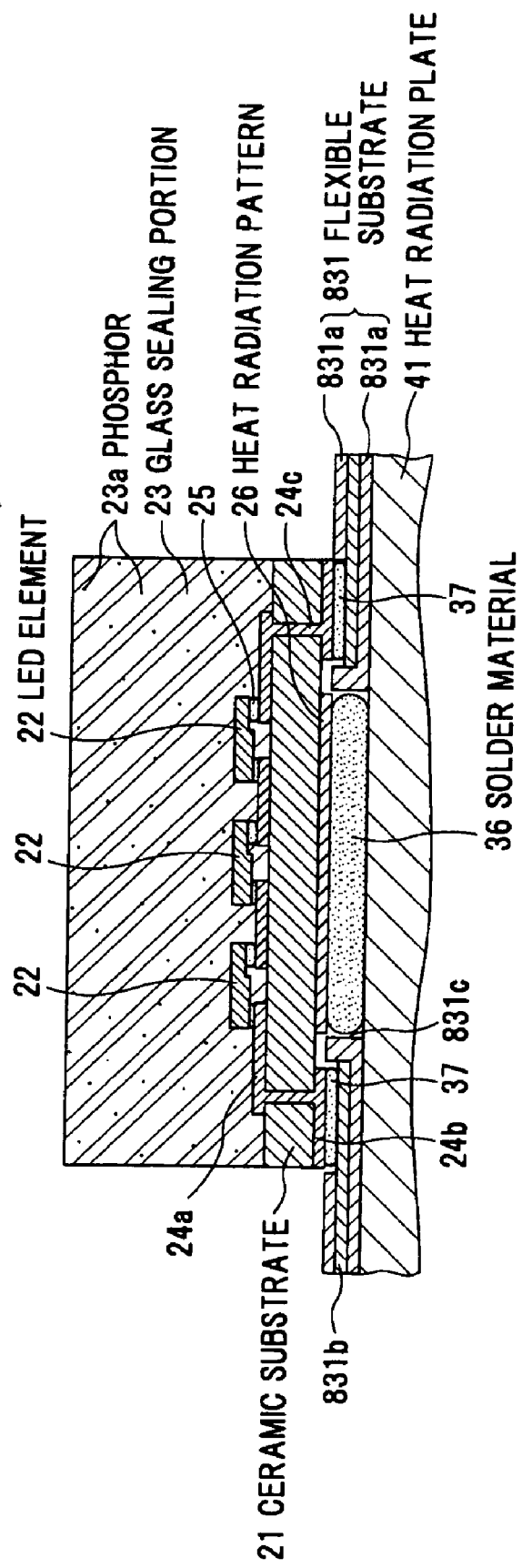
FIG. 15 is an enlarged cross sectional view showing a region R in FIG. 14A.

FIGS. 14A to 15 show the third preferred embodiment of the invention. FIG. 14A is a top view showing a linear light source portion 803 in the third embodiment. FIG. 14B is a side view showing the linear light source portion 803 with a flexible substrate 831 and the heat radiation plate 41 attached thereto. FIG. 15 is an enlarged cross sectional view showing a region R in FIG. 14A.

As shown in FIG. 4, the first embodiment is constructed such that glass-sealed LED 2 is bonded via the mounting board 31 to the heat radiation plate 41. In contrast, the third embodiment is constructed such that the glass-sealed LED 2 is bonded to the heat radiation plate 41 without the mounting board 31. Instead of the mounting board 31, a flexible substrate 831 is disposed between the glass-sealed LED 2 and the heat radiation plate 41. As shown in FIG. 14A, the linear light source portion 803 is formed longer than the linear light source portion 3 in the longitudinal direction. As shown in FIG. 14B, the heat radiation plate 41 is provided with rounded corners 41*c* at ends thereof where it contacts the flexible substrate 831. As shown in FIGS. 14A to 15, like components are indicated by the same numerals as used in the first embodiment. The detailed explanations thereof are omitted below.

The flexible substrate 831 is disposed between the glass-sealed LED 2 and the heat radiation plate 41. The flexible substrate 831 is composed of an insulating layer 831*a* and a circuit pattern 831*b* sandwiched by the insulating layer 831*a*. The insulating layer 831*a* is formed of polyimide, liquid-crystal polymer, BT (bismaleimide triazine) resin, Teflon (TM) etc., where liquid-crystal polymer is preferable since it is lower than others in deterioration of reflectivity in high temperature-high humidity environment.

The flexible substrate 831 is not bonded to the heat radiation plate 41 although the circuit pattern 831*b* thereof is bonded via the solder material 37 to the electrode pattern 24*b* formed on the bottom surface of the ceramic substrate 21. Thus, the flexible substrate 831 is only put on the heat radiation plate 41 while the heat radiation pattern 26 of the glass-sealed LED 2 is bonded via the solder material 36 (about 100 μm thick) to the heat radiation plate 41 within an opening 831*c* of the flexible substrate 831. In other words, a fine airspace or gap is formed between the flexible substrate 831 and the heat radiation plate 41. By the airspace or gap thus formed, heat can be prevented from being conducted directly to the flexible substrate 831. Thus, the flexible substrate 831 can be prevented from deteriorating due to heat.

The linear light source portion 803 is extended to be longer than the linear light source portion 3 in the longitudinal direction. The first pattern exposed portion 31*a* as an external connection terminal is located outside both ends of the heat radiation plate 41 in the longitudinal such that it is away from the metal member, i.e., the heat radiation plate 41. Thereby, short circuit can be prevented that may occur between an external wiring bonded to the first pattern exposed portion 31*a* and the heat radiation plate 41. Also, the extended part of the linear light source portion 803 may be used directly as an external wiring instead of using a separate external wiring.

The heat radiation plate 41 is provided with the rounded corners 41*c* at ends thereof where it contacts the flexible substrate 831. The linear light source portion 803 with the flexible substrate 831 can be bent freely outside the heat radiation plate 41 in the longitudinal direction. Thus, the rounded corners 41*c* can prevent the damage of the flexible substrate 831 when the linear light source portion 803 is repeatedly bent at the corners.

Modification 3

As shown in FIG. 16, the ceramic substrate 21 of the third embodiment may be modified such that it is provided with a protrusion 21*a* (with a height of about 100 μm) protruding downward. Thereby, the amount of the soldering material 36 used can be reduced to about 10 μm thick. The reduced amount can improve evenness or uniformity in thickness of the soldering material 36 formed between the heat radiation pattern 26 and the heat radiation plate 41, and can prevent short circuit between the electrode pattern 24*b* and the heat radiation plate 41 that may occur when the excessive soldering material 36 penetrates through the electrode pattern 24*b*. Also, the protrusion 21*a* can facilitate the positioning of the glass-sealed LED 2 relative to the flexible substrate 831 with the opening 831*c*. The protrusion 21*a* of the ceramic substrate 21 can be easy formed by stacking ceramic green sheets and then sintering them.

Modification 4

Alternatively, as shown in FIG. 17, the heat radiation plate 41 of the third embodiment may be modified such that it is provided with a protrusion 41*a* (with a height of about 100 μm) protruding upward. Thereby, the amount of the soldering material 36 used can be reduced to about 10 μm thick. The reduced amount can improve evenness or uniformity in thickness of the soldering material 36 formed between the heat radiation pattern 26 and the heat radiation plate 41, and can prevent short circuit between the electrode pattern 24b and the heat radiation plate 41 that may occur when the excessive soldering material 36 penetrates through the electrode pattern 24b. Also, the protrusion 41a can facilitate the positioning of the glass-sealed LED 2 with the flexible substrate 831 (with the opening 831c) relative to the heat radiation plate 41. The protrusion 41a of the heat radiation plate 41 can be formed by etching etc.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light source unit, comprising:
a linear light source portion comprising a plurality of glass-sealed light-emitting diodes (LED);
a heat radiation portion comprising a heat radiation plate connected to the linear light source portion; and
a case including an outside wall that is disposed apart from the linear light source portion and the heat radiation portion, a support portion connecting the outside wall to the heat radiation portion, and a vent hole formed in the outside wall,
wherein the support portion comprises an extension portion extending from the outside wall, and
wherein the extension portion extends from the outside wall inside the case such that the vent hole is defined by the extension portion.

2. The light source unit according to claim 1, wherein the case has a thermal conductivity lower than the heat radiation portion.

3. The light source unit according to claim 1, wherein:
the outside wall comprises a pair of sidewalls parallel, to the heat radiation portion; and
the support portion and the vent hole are formed in at least one of the pair of sidewalls.

4. The light source unit according to claim 3, wherein:
the ease comprises a bottom wall connected with the pair of sidewalls; and
the bottom wall supports an end portion of the heat radiation portion on an opposite side to the linear light source portion.

5. The light source unit according to claim 4, wherein the bottom wall supports the heat radiation portion at a position higher than a part where the bottom wall is connected with the pair of sidewalls.

6. The light source unit according to claim 1, wherein the heat radiation portion further comprises a reflection plate comprising a fixing portion fixed to the heat radiation portion and a reflection mirror portion extended apart from the linear light source portion in a lateral direction for reflecting light emitted from the linear light source portion.

7. The light source unit according to claim 1, further comprising a lens secured to the outside wall of the case for optically controlling light emitted from the linear light source portion.

8. The light source unit according to claim 1, wherein:
the heat radiation portion further comprises a reflection plate for reflecting light emitted from the plurality of glass-sealed light-emitting diodes (LED);
the case comprises a thermal conductivity lower than that of the heat radiation portion; and
the reflection plate comprises a thermal conductivity between that of the case and the heat radiation portion.

9. The light source unit according to claim 1, wherein the support portion further comprises a contact portion extending from an end of the extension portion.

10. The light source unit according to claim 1,
wherein the plurality of glass-sealed light-emitting diodes (LED) further comprises:
a plurality of LED elements;
a ceramic substrate beneath the plurality of LED elements;
a circuit pattern beneath the plurality of LED elements, and
wherein a heat radiation pattern is located beneath the ceramic substrate.

11. The light source unit according to claim 10, further comprising a board body having a heat radiation exposed portion, wherein the heat radiation pattern is located in between the board body and the ceramic substrate.

12. The light source unit according to claim 11, wherein a solder material is located between the heat radiation pattern and the heat radiation exposed portion of the board body.

13. The light source unit according to claim 11 wherein the board body is located between the ceramic substrate and the heat radiation plate.

14. The light source unit according to claim 1, wherein the heat radiation portion further comprises a pair of reflection plates, wherein the heat radiation plate is located in between a pair of reflection plates.

15. A light source unit, comprising:
a light source portion;
a heat radiation portion connected to the light source portion; and
a case including an outside wall, a support portion connecting the outside wall to the heat radiation portion, and a vent hole located on the outside wall,
wherein the support portion comprises an extension portion extending from the outside wall inside the case to define the vent hole,
wherein the light source portion further comprises:
plurality of light-emitting diode (LED) elements;
a circuit pattern beneath the plurality of LED elements; and
a ceramic substrate enveloped by the circuit pattern, and
wherein a heat radiation pattern is located beneath the ceramic substrate.

16. The light source unit according to claim 15, wherein the support portion further comprises a contact portion extending from an end of the extension portion.

17. A light source unit, comprising:
a light source portion;
a heat radiation portion connected to the tight source portion; and
a case including an outside wall, a support portion connecting the outside wall to the heat radiation portion, and a vent hole located on the outside wall,
wherein the support portion comprises an extension portion that protrudes from the outside wall to define the vent hole,
wherein the light source portion further comprises:
a plurality of light-emitting diode (LED) elements;
a circuit pattern connected to the plurality of LED elements; and
a ceramic substrate located within the circuit pattern, and wherein the ceramic substrate is located between a heat radiation pattern and the plurality of LED elements.

18. The light source unit according to claim 17, further comprising a board body having a heat radiation exposed portion, wherein the heat radiation pattern is located in between the board body and the ceramic substrate.

* * * * *